(12) United States Patent
Ishikawa et al.

(10) Patent No.: US 12,018,372 B2
(45) Date of Patent: Jun. 25, 2024

(54) GAS INJECTOR FOR EPITAXY AND CVD CHAMBER

(71) Applicant: Applied Materials, Inc., Santa Clara, CA (US)

(72) Inventors: Tetsuya Ishikawa, San Jose, CA (US); Swaminathan T. Srinivasan, Pleasanton, CA (US); Matthias Bauer, Sunnyvale, CA (US); Ala Moradian, Sunnyvale, CA (US); Manjunath Subbanna, Bangalore (IN); Kartik Bhupendra Shah, Saratoga, CA (US); Errol Antonio C. Sanchez, Tracy, CA (US); Sohrab Zokaei, Los Altos, CA (US); Michael R. Rice, Pleasanton, CA (US); Peter Reimer, Los Altos, CA (US)

(73) Assignee: Applied Materials, Inc., Santa Clara, CA (US)

( * ) Notice: Subject to any disclaimer, the term of this patent is extended or adjusted under 35 U.S.C. 154(b) by 390 days.

(21) Appl. No.: 17/317,342

(22) Filed: May 11, 2021

(65) Prior Publication Data

US 2022/0364231 A1 Nov. 17, 2022

(51) Int. Cl.
*C23C 16/40* (2006.01)
*B01J 4/00* (2006.01)
(Continued)

(52) U.S. Cl.
CPC .......... *C23C 16/4558* (2013.01); *B01J 4/005* (2013.01); *B01J 4/008* (2013.01); *C23C 16/4412* (2013.01); *C23C 16/45587* (2013.01)

(58) Field of Classification Search
CPC .......... C23C 16/4558; C23C 16/4412; C23C 16/45587; C23C 16/45559;
(Continued)

(56) References Cited

U.S. PATENT DOCUMENTS 5,792,272 A * 8/1998 van Os ............... H01J 37/3244
118/723 R
5,851,294 A * 12/1998 Young ............... C23C 16/45563
156/345.33
(Continued)

FOREIGN PATENT DOCUMENTS

CN 103088415 A 5/2013

OTHER PUBLICATIONS

International Search Report and Written Opinion for International Application No. PCT/US2022/025540 dated Aug. 4, 2022.
(Continued)

*Primary Examiner* — Rudy Zervigon
(74) *Attorney, Agent, or Firm* — Patterson + Sheridan, LLP

(57) ABSTRACT

The present disclosure generally relates to gas inject apparatus for a process chamber for processing of semiconductor substrates. The gas inject apparatus include one or more gas injectors which are configured to be coupled to the process chamber. Each of the gas injectors are configured to receive a process gas and distribute the process gas across one or more gas outlets. The gas injectors include a plurality of pathways, a fin array, and a baffle array. The gas injectors are individually heated. A gas mixture assembly is also utilized to control the concentration of process gases flown into a process volume from each of the gas injectors. The gas mixture assembly enables the concentration as well as the flow rate of the process gases to be controlled.

20 Claims, 20 Drawing Sheets

(51) Int. Cl.
  *C23C 16/44* (2006.01)
  *C23C 16/455* (2006.01)

(58) Field of Classification Search
  CPC . C23C 16/45561; C23C 16/46; C23C 16/482;
  B01J 4/005; B01J 4/008; H01J 37/3244;
  H01J 37/32449
  USPC ................ 118/715; 156/345.33, 345.34
  See application file for complete search history.

(56) References Cited

U.S. PATENT DOCUMENTS

| | | | |
|---|---|---|---|
| 5,885,358 A * | 3/1999 | Maydan | ............... C23C 16/455 118/723 R |
| 6,301,434 B1 | 10/2001 | McDiarmid et al. | |
| 8,183,132 B2 | 5/2012 | Nijhawan et al. | |
| 8,307,781 B2 * | 11/2012 | Suzuki | ............. C23C 16/45565 118/723 R |
| 8,491,720 B2 | 7/2013 | Ishikawa et al. | |
| 8,568,529 B2 | 10/2013 | Ishikawa et al. | |
| 9,053,909 B2 * | 6/2015 | Kato | ................... C23C 16/452 |
| 9,929,027 B2 | 3/2018 | Ranish et al. | |
| 10,145,011 B2 | 12/2018 | Abedijaberi et al. | |
| 10,202,707 B2 | 2/2019 | Ranish et al. | |
| 2003/0092266 A1 * | 5/2003 | Anderson | ......... H01L 21/67023 438/689 |
| 2003/0219981 A1 | 11/2003 | Ammon et al. | |
| 2005/0103261 A1 | 5/2005 | Von Ammon et al. | |
| 2006/0219362 A1 | 10/2006 | Han et al. | |
| 2007/0087533 A1 | 4/2007 | Nishikawa et al. | |
| 2008/0017116 A1 | 1/2008 | Campbell et al. | |
| 2008/0173238 A1 * | 7/2008 | Nakashima | ......... C23C 16/4584 438/758 |
| 2010/0092697 A1 | 4/2010 | Poppe et al. | |
| 2010/0092698 A1 | 4/2010 | Poppe et al. | |
| 2010/0215872 A1 | 8/2010 | Sivaramakrishnan et al. | |
| 2010/0258049 A1 | 10/2010 | Ishikawa et al. | |
| 2010/0258052 A1 | 10/2010 | Ishikawa et al. | |
| 2010/0261340 A1 | 10/2010 | Nijhawan et al. | |
| 2010/0263587 A1 | 10/2010 | Sivaramakrishnan et al. | |
| 2012/0088356 A1 | 4/2012 | Santhanam et al. | |
| 2012/0240853 A1 * | 9/2012 | Carlson | ............. C23C 16/45574 118/715 |
| 2014/0137801 A1 | 5/2014 | Lau et al. | |
| 2014/0199056 A1 | 7/2014 | Chang et al. | |
| 2014/0273410 A1 | 9/2014 | Abedijaberi et al. | |
| 2014/0322897 A1 | 10/2014 | Samir et al. | |
| 2016/0056059 A1 | 2/2016 | Sun et al. | |
| 2016/0217979 A1 * | 7/2016 | Kim | .................... H01J 37/3244 |
| 2016/0289830 A1 | 10/2016 | Abedijaberi et al. | |
| 2016/0376706 A1 | 12/2016 | Miller et al. | |
| 2018/0005856 A1 | 1/2018 | Chang et al. | |
| 2018/0122638 A1 | 5/2018 | Jung et al. | |
| 2018/0209043 A1 | 7/2018 | Lau et al. | |
| 2018/0266017 A1 * | 9/2018 | Park | ........................ C30B 25/14 |
| 2019/0105614 A1 * | 4/2019 | Pandey | ............. H01L 21/67017 |
| 2020/0071832 A1 | 3/2020 | Lau et al. | |
| 2020/0385866 A1 | 12/2020 | Srinivasan et al. | |
| 2021/0013055 A1 | 1/2021 | Schaller et al. | |
| 2021/0189593 A1 | 6/2021 | Burrows et al. | |

OTHER PUBLICATIONS

International Search Report and Written Opinion for Application No. PCT/US2022/025772 dated Aug. 4, 2022.
International Search Report and Written Opinion for PCT/US2022/026071 dated Aug. 10, 2022.
International Search Report and Written Opinion for International Application No. PCT/US2022/025321 dated Aug. 31, 2022.

* cited by examiner

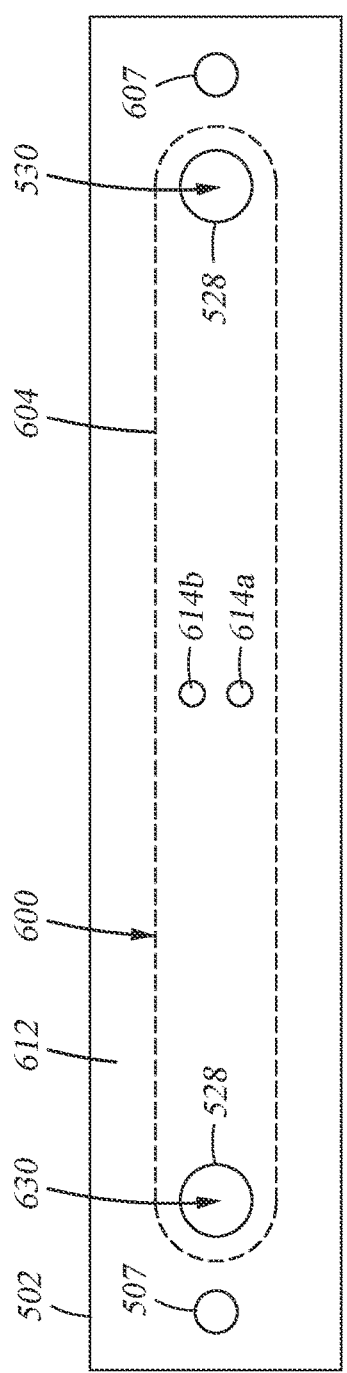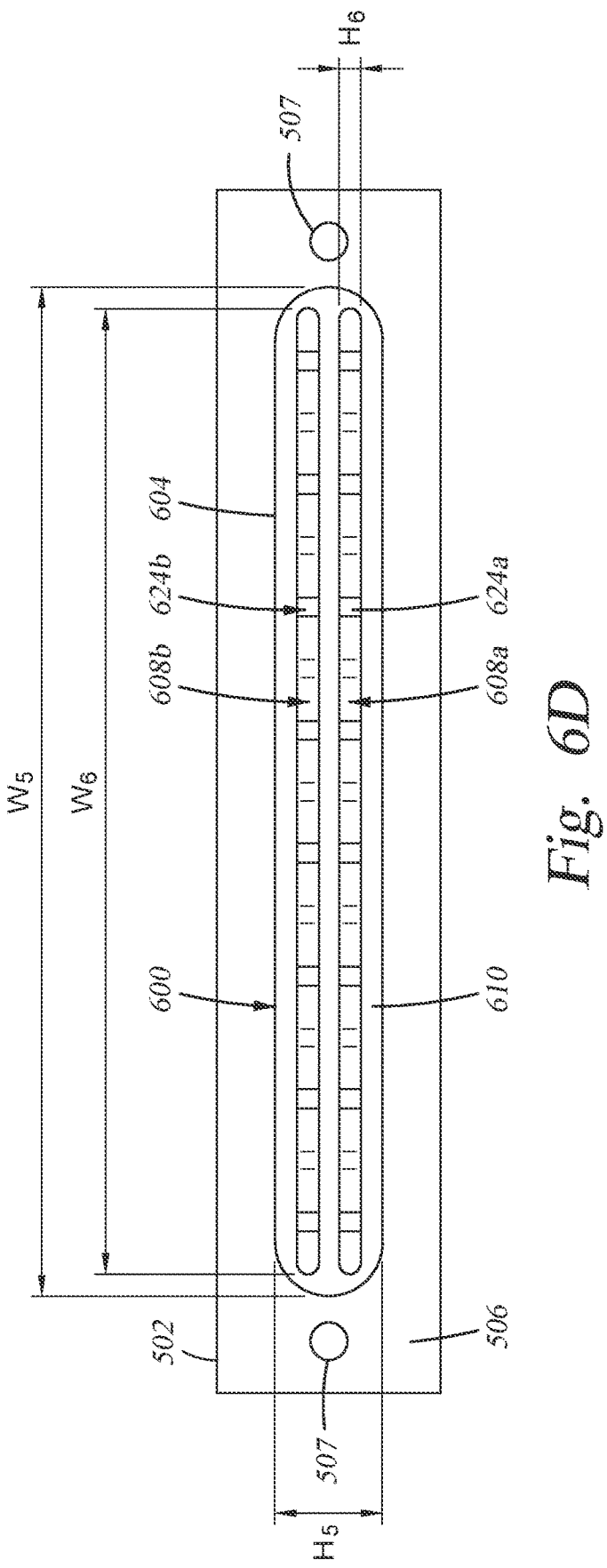

GAS INJECTOR FOR EPITAXY AND CVD CHAMBER

BACKGROUND

Field

Embodiments of the present disclosure generally relate to apparatus and methods for fabricating semiconductor devices. More specifically, apparatus disclosed herein relate to components for gas injection within a semiconductor processing.

Description of the Related Art

Semiconductor substrates are processed for a wide variety of applications, including the fabrication of integrated devices and microdevices. During processing, the substrate is positioned on a susceptor within a process chamber. The susceptor is supported by a support shaft, which is rotatable about a central axis. Precise control over a heating source, such as a plurality of heating lamps disposed below and above the substrate, allows the substrate to be heated within very strict tolerances. The temperature of the substrate can affect the uniformity of the material deposited on the substrate.

The ability to precisely control substrate temperatures within the process chamber has a significant impact throughput and production yields. Conventional process chambers have difficulty meeting temperature control criteria needed to fabricate next generation devices while meeting ever increasing demands for improved production yields and faster throughput.

Therefore, a need exists for improved process chambers and gas injection apparatus which enable low cost replacement of hardware components and increased control of gas flow across a substrate.

SUMMARY

In one embodiment of the present disclosure, a gas injector for use within a process chamber is described. The gas injector includes an injector base body and an injector insert coupled to and extending outward from the injector base body. The injector insert includes a gas introduction passage, a gas diffusion passage, and an outlet opening. The gas introduction passage is disposed through the injector base body and fluidly coupled to the injector insert. The gas diffusion passage is coupled to the gas introduction passage and forms a gas distribution tree. The outlet opening is disposed through an inject surface of the injector insert opposite the gas introduction passage and in fluid communication with the gas diffusion passage.

In another embodiment, a process chamber for substrate processing is described. The process chamber includes a base ring, and inject ring, and one or more gas injectors. The base ring includes a substrate transfer passage and one or more upper chamber exhaust passages disposed therethrough. The inject ring is disposed on top of the base ring and includes one or more injector passages disposed therethrough. Each of the one or more gas injectors is disposed inside of one of the injector passages. Each of the gas injectors includes an injector base body configured to couple to an injector support surface of the inject ring and an injector insert extending outward from the injector base body. The injector insert includes a gas introduction passage, a gas diffusion passage, and an outlet opening disposed through an inject surface of the injector insert opposite the gas introduction passage and in fluid communication with the gas diffusion passage.

In another embodiment, a gas mixture assembly for use with a processing chamber is described. The gas mixture assembly includes a process gas source, a gas reservoir, an exhaust divert valve, an exhaust pump, a plurality of splitter valves, a process chamber, and a master flow controller. The gas reservoir is fluidly coupled to the process gas source. The exhaust divert valve is fluidly coupled to the gas reservoir. The exhaust pump is fluidly coupled to the exhaust divert valve. The plurality of splitter valves are disposed in parallel and fluidly coupled to the gas reservoir. The process chamber includes a process volume is in fluid communication with each of the splitter valves. The master flow controller is configured to control a flow rate through each of the exhaust divert valve and the plurality of splitter valves.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

FIG. 6C is a schematic side view of the gas injector of FIG. 6A from a first side, according to embodiments of the present disclosure.

FIG. 6D is a schematic side view of the gas injector of FIG. 6A from a second side, according to embodiments of the present disclosure.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

The present disclosure generally relates to apparatus for semiconductor processing. More specifically, apparatus disclosed herein relate to a process chamber and its components. The process chamber is configured as a thermal deposition chamber, such as an epitaxial deposition chamber. The process chamber disclosed herein enables improved process gas flow and substrate heating. The process chamber has less expensive components compared to conventional chambers, thus reducing the cost for replacement of portions of the process chamber after the portion of the chamber body is worn or when an improved design to a portion of the chamber body is available. The disclosed process chamber overcomes conventional challenges, including improved process gas flow through the chamber volume and more uniform thermal control, which enables better throughput with increased process yields.

Also, disclosed herein are components of the process chamber. The components disclosed herein include an inject ring, a base ring, an upper lamp module, a lower lamp module, a susceptor, a rotation assembly, an upper liner, a lower liner, and one or more heating elements. Each of the process chamber components are used together to flow one or more process gases horizontally across the surface of a substrate. The process chamber components are coupled together and form a process volume in which a substrate is processed, for example, by epitaxial deposition.

Figure 1:
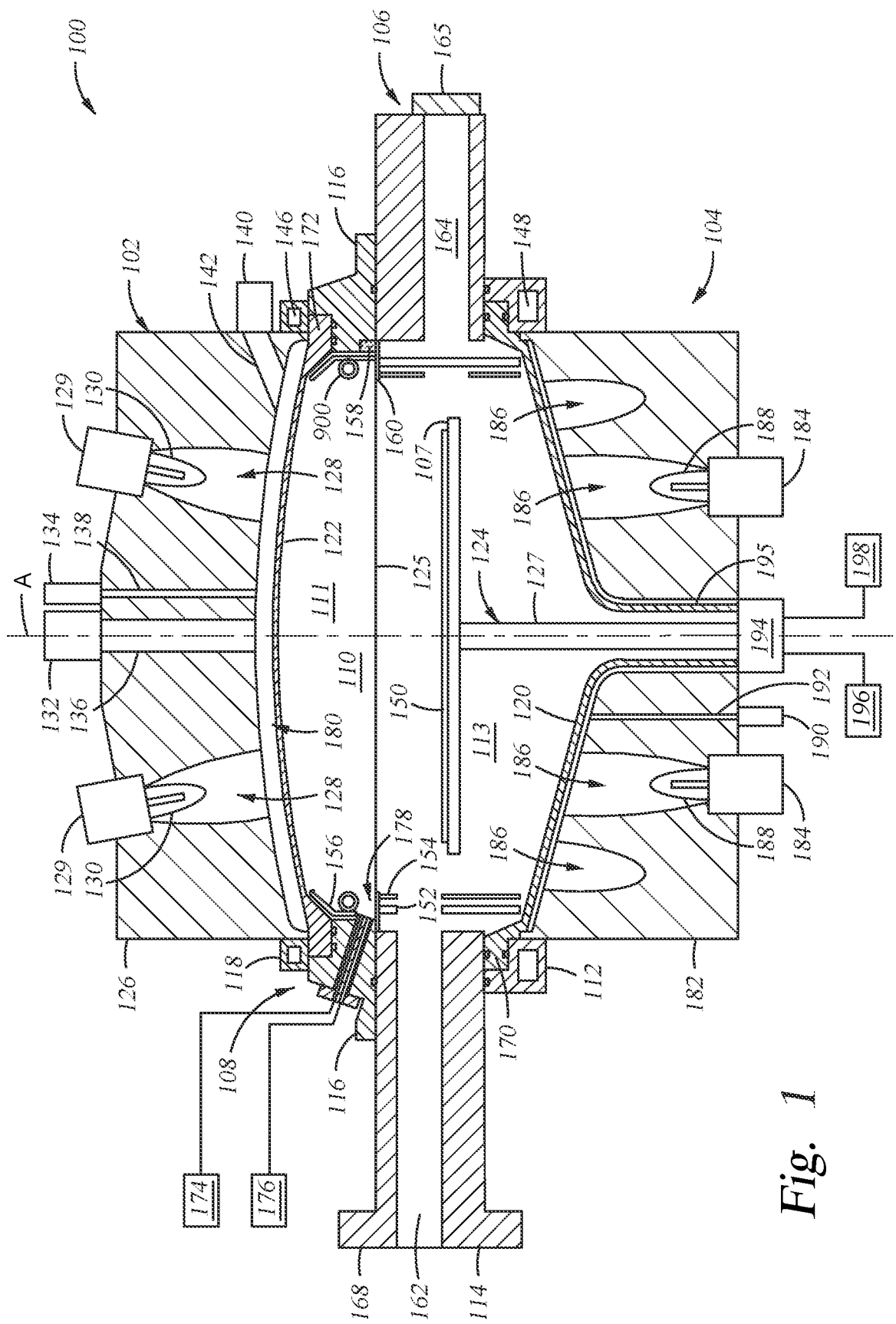
FIG. 1 is a schematic illustration of a process chamber, according to embodiments of the present disclosure.

FIG. 1 is a schematic illustration of a process chamber 100, according to embodiments of the present disclosure. The process chamber 100 is an epitaxial deposition chamber and may be used as part of a cluster tool (not shown). The process chamber 100 is utilized to grow an epitaxial film on a substrate, such as the substrate 150. The process chamber 100 creates a cross-flow of precursors across the top surface of the substrate 150 during processing.

The process chamber 100 includes an upper lamp module 102, a lower lamp module 104, a chamber body assembly 106, a susceptor assembly 124, a lower window 120, and an upper window 122. The susceptor assembly 124 is disposed between the upper lamp module 102 and the lower lamp module 104. The lower window 120 is disposed between the susceptor assembly 124 and the lower lamp module 104. The upper window 122 is disposed between the susceptor assembly 124 and the upper lamp module 102.

The upper lamp module 102 is disposed over the susceptor assembly 124 and configured to heat a substrate, such as the substrate 150, disposed on the susceptor assembly 124. The upper lamp module 102 includes an upper module body 126 and a plurality of lamp apertures 128 disposed through the upper module body 126. Each of the plurality of lamp apertures 128 includes a lamp 130 disposed therein. Each of the lamps 130 are coupled to a lamp base 129. Each of the lamp bases 129 supports one of the lamps 130 and electrically couples each of the lamps 130 to a power source (not shown). Each of the lamps 130 are elongated and secured in a generally vertical orientation within the lamp apertures 128. As described herein, the generally vertical orientation of the lamps 130 is approximately perpendicular to the substrate support surface of the susceptor assembly 124. The vertical orientation of the lamps 130 is not necessarily perpendicular to the substrate support surface, but may also be at an angle of about 30 degrees to about 150 degrees with respect to the substrate support surface 107, such as an angle of about 45 degrees to about 135 degrees with respect to the substrate support surface 107, such as an angle of about 70 degrees to about 110 degrees with respect to the substrate support surface 107.

Continuing to refer to FIG. 1, the upper lamp module 102 further includes a heated gas passage 136 and a pyrometer passage 138. A heated gas supply source 132 is fluidly coupled to the heated gas passage 136. The heated gas passage 136 extends from the top surface to the bottom surface of the upper module body 126. The heated gas passage 136 is configured to allow heated gas, such as heated air or a heated inert gas, to flow from the heated gas supply source 132 to the top surface of the upper window 122 to convectively heat the upper window 122. The heated gas is supplied to an upper plenum 180 defined between the upper lamp module 102 and the upper window 122. A heated gas exhaust passage 142 is also disposed through the upper module body 126. The heated gas exhaust passage 142 is coupled to a heated exhaust pump 140. The heated exhaust pump 140 removes gas from the upper plenum 180. The heated exhaust pump 140 may also function as an exhaust pump for the process volume. The heated gas exhaust passage 142, in some embodiments, may be a groove formed along an edge of the upper module body 126 or may be formed through a separate component in fluid communication with the upper plenum 180.

The pyrometer passage 138 is disposed through the upper module body 126 to enable a pyrometer 134, such as a scanning pyrometer, to measure the temperature of the substrate 150. The pyrometer 134 is disposed on top of the upper module body 126 adjacent to the pyrometer passage 138. The pyrometer passage 138 extends from the top surface of the upper module body 126 to the bottom surface adjacent to the upper window 122.

The lower lamp module 104 is disposed below the susceptor assembly 124 and configured to heat a bottom side of the substrate 150 disposed on the susceptor assembly 124. The lower lamp module 104 includes a lower module body 182 and a plurality of lamp apertures 186 disposed through the lower module body 182. Each of the plurality of lamp apertures 186 includes a lamp 188 disposed therein. Each of the lamps 188 are disposed in a generally vertical orientation and coupled to a lamp base 184. Each of the lamp bases 184 supports one of the lamps 188 and electrically couples each of the lamps 188 to a power source (not shown). As described herein, the generally vertical orientation of the lamps 188 is described with respect to the substrate support surface of the susceptor assembly 124. The generally vertical orientation is not necessarily perpendicular to the substrate support surface, but may also be at an angle of about 30 degrees to about 150 degrees with respect to the substrate support surface, such as an angle of about 45 degrees to about 135 degrees with respect to the substrate support surface, such as an angle of about 70 degrees to about 110 degrees with respect to the substrate support surface.

The lower lamp module 104 further includes a susceptor shaft passage 195 and a pyrometer passage 192. A support shaft 127 of the susceptor assembly 124 is disposed through the susceptor shaft passage 195. The susceptor shaft passage 195 is disposed through the middle of the lower module body 182. The susceptor shaft passage 195 is configured to allow the support shaft 127 of the susceptor assembly 124 and a portion of the lower window 120 to pass through the lower module body 182.

The pyrometer passage 192 is disposed through the lower module body 182 to enable a pyrometer 190, such as a scanning pyrometer, to measure the temperature of the bottom surface of the substrate 150 or the bottom surface of the substrate support. The pyrometer 190 is disposed below the lower module body 182 adjacent to the pyrometer passage 192. The pyrometer passage 192 is disposed from the bottom surface of the lower module body 182 to the top surface of the lower module body 182 adjacent to the lower window 120.

Continuing to refer to FIG. 1, the chamber body assembly 106 includes an inject ring 116 and a base ring 114. The inject ring 116 is disposed on top of the base ring 114. The inject ring 116 includes one or more gas injectors 108 disposed therethrough. The base ring 114 includes a substrate transfer passage 162, one or more upper chamber exhaust passages 326 (FIG. 3C), and a lower chamber exhaust passage 164 disposed therethrough. The substrate transfer passage 162 is disposed opposite the one or more upper chamber exhaust passages 326 and the lower chamber exhaust passage 164. Each of the one or more upper chamber exhaust passages 326 are coupled to an exhaust module 165.

An upper chamber 111 is the portion of a process volume 110 in which the substrate 150 is processed and process gases are injected. The lower chamber 113 is the portion of the process volume 110 in which the substrate 150 is loaded onto the susceptor assembly 124. The upper chamber 111 may also be understood as the volume above a susceptor of the susceptor assembly 124 while the susceptor assembly 124 is in a processing position. The lower chamber 113 is understood to be the volume below the susceptor of the susceptor assembly 124 while the susceptor assembly 124 is in the processing position. The processing position (not shown) is the position wherein the substrate 150 is disposed even with or above the horizontal plane 125. The horizontal plane 125 is the plane through which the inject ring 116 and the base ring 114 contact one another.

The one or more upper chamber exhaust passages 326 and the lower chamber exhaust passage 164 are coupled to one or more exhaust pumps (not shown). The one or more exhaust pumps are configured to remove exhaust gases from the process volume 110 via the one or more upper chamber exhaust passages 326 and the lower chamber exhaust passage 164. In some embodiments, each of the upper chamber exhaust passages 326 and the lower chamber exhaust passage 164 are coupled to a single exhaust pump using a plurality of conduits. In another embodiment, the upper chamber exhaust passages 326 are coupled to a different exhaust pump than the lower chamber exhaust passage 164.

The substrate transfer passage 162 is formed through the base ring 114 and is configured to allow a substrate to pass therethrough from a transfer chamber of a cluster tool (not shown). A flange 168 is attached to one end of the base ring 114 to enable the attachment of the process chamber 100 to a cluster tool (not shown). The substrate transfer passage 162 passes through the flange 168.

An upper cooling ring 118 and a lower cooling ring 112 are disposed on opposite sides of the chamber body assembly 106. The upper cooling ring 118 is disposed on top of the inject ring 116 and is configured to cool the inject ring 116. The lower cooling ring 112 is disposed below the base ring 114 and is configured to cool the base ring 114. The upper cooling ring 118 includes a coolant passage 146 disposed therethrough. The coolant which is circulated through the coolant passage 146 may include water or oil in some embodiments. The lower cooling ring 112 includes a coolant passage 148 disposed therethrough. The coolant which is circulated through the coolant passage 148 is similar to the coolant circulated through the coolant passage 146 of the upper cooling ring 118. In some embodiments, the upper cooling ring 118 and the lower cooling ring 112 assist in securing the inject ring 116 and the base ring 114 in place. The upper cooling ring 118 may partially support the upper lamp module 102 while the lower cooling ring 112 may partially support the base ring 114 and the inject ring 116.

The use of the upper cooling ring 118 and the lower cooling ring 112 reduces the temperature of the inject ring 116 and the base ring 114 without the need for additional cooling channels being disposed through the inject ring 116 and the base ring 114 as present in conventional rings. This reduces the cost of the production of the inject ring 116 and the base ring 114, which are more frequently replaced than the upper cooling ring 118 and the lower cooling ring 112. In some embodiments, the inject ring 116 may have an additional coolant passage 421 (FIG. 4A) disposed therethrough.

The one or more gas injectors 108 of the inject ring 116 are disposed through one or more openings within the inject ring 116. In embodiments described herein, there are a plurality of gas injectors 108 disposed through the inject ring 116. The one or more gas injectors 108 are configured to supply process gases to a process volume 110 via one or more gas outlets 178. A single one of the one or more gas injectors 108 is shown in FIG. 1. The gas injector 108 is shown as being disposed so the one or more gas outlets 178 are pointed downward toward the susceptor assembly 124 and the substrate 150. The downward angle of the gas injector 108 may be an angle of greater than about 5 degrees from the horizontal, such as greater than about 10 degrees from the horizontal. Each of the one or more gas outlets 178 are fluidly coupled to one or more process gas supply sources, such as the first process gas supply source 174 or the second process gas supply source 176. In some embodiments, only a first process gas supply source 174 is utilized. In embodiment in which both the first process gas supply source 174 and the second process gas supply source 176 are utilized, there are two gas outlets 178 within each gas injector 108. The two gas outlets 178 are disposed in a stacked fashion and enable mixing of the gases only after the gases enter the process volume 110. In some embodiments, the first process gas supply source 174 is a process gas while the second process gas supply source 176 is a cleaning gas. In other embodiments, both the first process gas supply source 174 and the second process gas supply source 176 are process gases.

The upper window 122 is disposed between the inject ring 116 and the upper lamp module 102. The upper window 122 is an optically transparent window, such that radiant energy produced by the upper lamp module 102 may pass therethrough. In some embodiments, the upper window 122 is formed of a quartz or a glass material. The upper window 122 is a dome shape and in some embodiments is described as an upper dome. The outer edges of the upper window 122 form peripheral supports 172. The peripheral supports 172 are thicker than the central portion of the upper window 122. The peripheral supports 172 are disposed on top of the inject ring 116. The peripheral supports 172 connect to the central portion of the upper window 122 and are formed of the optically transparent material of the central portion of the upper window 122.

The lower window 120 is disposed between the base ring 114 and the lower lamp module 104. The lower window 120 is an optically transparent window, such that radiant energy produced by the lower lamp module 104 may pass therethrough. In some embodiments, the lower window 120 is formed of a quartz or a glass material. The lower window 120 is a dome shape and in some embodiments is described as a lower dome. The outer edges of the lower window 120 form peripheral supports 170. The peripheral supports 170 are thicker than the central portion of the lower window 120. The peripheral supports 170 connect to the central portion of the lower window 120 and are formed of the same optically transparent material.

A variety of liners and heaters are disposed inside of the chamber body assembly 106 and within the process volume 110. As shown in FIG. 1, there is an upper liner 156 and a lower liner 154 disposed within the chamber body assembly 106. The upper liner 156 is disposed above the lower liner 154 and inward of the inject ring 116. The lower liner 154 is disposed inward of the base ring 114. The upper liner 156 and the lower liner 154 are configured to be coupled together while in the process volume. The upper liner 156 and the lower liner 154 are configured to shield the inner surfaces of the inject ring 116 and the base ring 114 from the process gases within the process volume. The upper liner 156 and the lower liner 154 further serve to reduce heat loss from the process volume to the inject ring 116 and the base ring 114. Reduced heat loss improves heating uniformity of the substrate 150 and enables more uniform deposition on the substrate 150 during processing.

An upper heater 158 and a lower heater 152 are also disposed within the chamber body assembly 106 and the process volume 110. As shown in FIG. 1, the upper heater 158 is disposed between the upper liner 156 and the inject ring 116 while the lower heater 152 is disposed between the lower liner 154 and the base ring 114. Both of the upper heater 158 and the lower heater 152 are disposed inward of the chamber body assembly 106 to enable more uniform heating of the substrate 150 while the substrate 150 is within the process chamber 100. The upper heater 158 and the lower heater 152 reduce heat loss to the walls of the chamber body assembly 106 and create a more uniform temperature distribution around the surfaces forming the process volume 110. Each of the upper liner 156, the lower liner 154, the upper heater 158, and the lower heater 152 are coupled to a flange 160 disposed within the process volume 110. The flange 160 is a horizontal surface configured to be secured between a portion of the inject ring 116 and the base ring 114 to enable securing of each of the upper liner 156, the lower liner 154, the upper heater 158, and the lower heater 152. Both the upper heater 158 and the lower heater 152 may be configured to have a heated fluid run therethrough or may be resistive heaters. The upper heater 158 and the lower heater 152 are further shaped to accommodate openings through the inject ring 116 and the base ring 114.

The susceptor assembly 124 is disposed within the process volume 110 and is configured to support the substrate 150 during processing. The susceptor assembly 124 includes a planar upper surface for supporting the substrate 150 and a shaft which extends through a portion of the lower window 120 and the lower lamp module 104. The susceptor assembly 124 is coupled to a movement assembly 194. The movement assembly 194 includes a rotation assembly 196 and a lift assembly 198. The rotation assembly 196 is configured to rotate the susceptor assembly 124 about a central axis A, while the lift assembly 198 is configured to move the susceptor assembly 124 linearly within the process volume 110 along the central axis A.

Figure 2A:
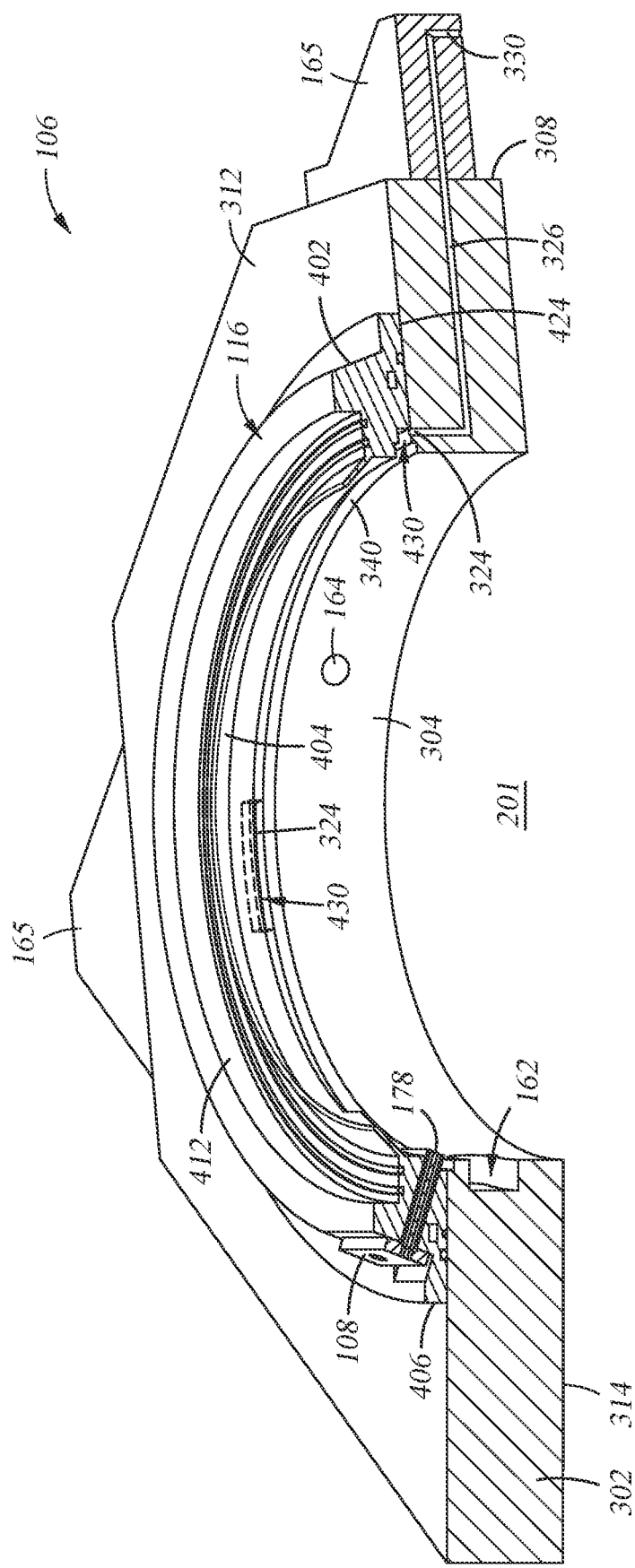
FIG. 2A is a schematic cross sectional view of a chamber body assembly, according to embodiments of the present disclosure.

FIG. 2A is a schematic cross sectional perspective view of the chamber body assembly 106, according to embodiments of the present disclosure. The chamber body assembly 106 includes the inject ring 116 disposed on top of and coupled to the base ring 114. The inject ring 116 includes the one or more gas injectors 108. The inject ring 116 includes an inner surface 404 and the base ring 114 includes an inner surface 304. The inner surfaces 304, 404 of both the base ring 114 and the inject ring 116 are aligned with one another, such that the inner surfaces 304, 404 have the same diameter for at least a portion of the circumference of the base ring 114 and the inject ring 116. The inner surfaces 304, 404 of the base ring 114 and the inject ring 116 form a central opening 201. The central opening 201 includes both an opening 310 of the base ring 114 and an opening 410 of the inject ring 116. A top surface 312 of the base ring is in contact with a bottom surface 424 of the inject ring 116.

One or more gas injectors 108 are disposed on one side of the chamber body assembly 106, while one or more upper chamber exhaust passage openings 324 are disposed on an opposite side of the chamber body assembly 106. Each of the one or more upper chamber exhaust passage openings 324 are aligned with an indent 430 formed in the inner surface of the inject ring 116. The alignment of each of the one or more indents 430 and the upper chamber exhaust passage openings 324 enables gas which is injected by the one or more gas injectors 108 to flow across the process volume 110 (FIG. 1) and over the substrate 150 before being removed from the process volume 110 via the upper chamber exhaust passage openings 324. The indents 430 assist in collecting the exhaust gases and directing the exhaust gases downward from an area even with the inject ring 116 towards the upper chamber exhaust passage openings 324. Once the exhaust gas enters the upper chamber exhaust passage openings 324, the exhaust gas flows through one or more upper chamber exhaust passages 326 and out an exhaust outlet 330.

The combination of the indents 430 and the upper chamber exhaust passage openings 324 reduces the complexity of manufacturing the base ring 114 and/or the inject ring 116. The combination of the indents 430 and the upper chamber exhaust passage openings 324 further enables process gas to flow horizontally across the process volume 110 and remain in the upper chamber 111 without diverting downward into the lower chamber 113 where it may become a source of contamination.

Figure 2B:
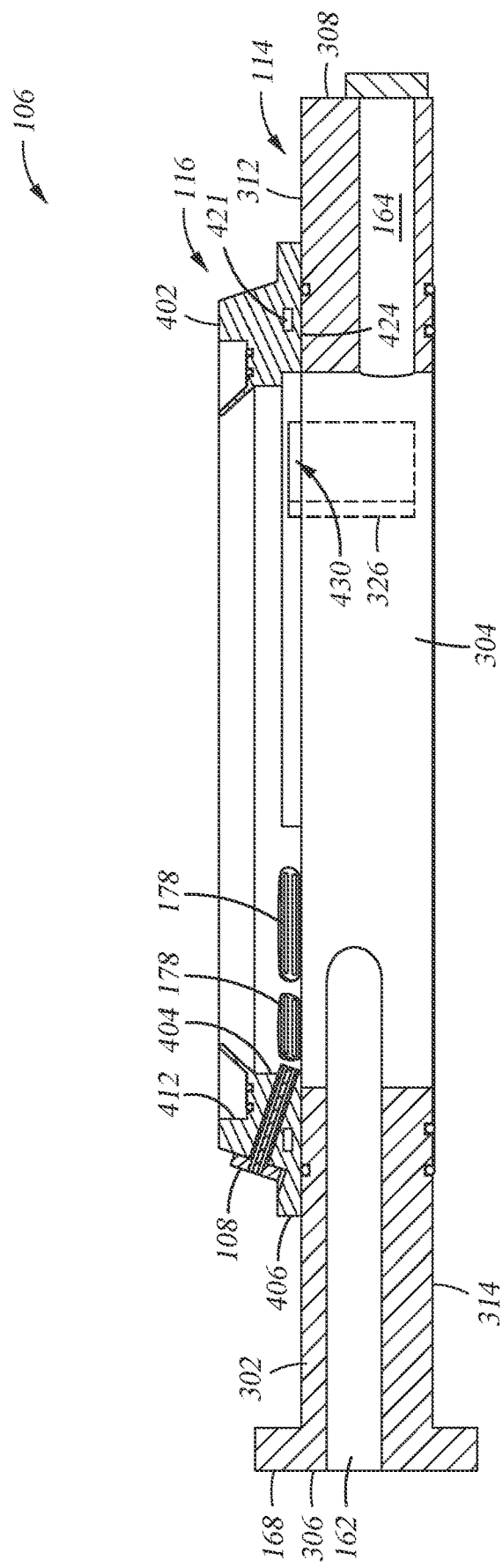
FIG. 2B is a schematic cross sectional view of the chamber body assembly of FIG. 2A through another plane, according to embodiments of the present disclosure.

FIG. 2B is a schematic cross sectional view of the chamber body assembly 106 of FIG. 2A taken through another plane, according to embodiments of the present disclosure. The cross section shown in FIG. 2B illustrates the lower chamber exhaust passage 164 and the relationship between the orientation of the lower chamber exhaust passage 164 and at least one of the upper chamber exhaust passage openings 324, the indent 430, and the upper chamber exhaust passage 326. The indent 430, the upper chamber exhaust passage opening 324, and the upper chamber exhaust passage 326 are disposed at an angle to the lower chamber exhaust passage 164 as described with reference to FIGS. 3B, 3C, and 4B. The indents 430 and the upper chamber exhaust passage openings 324 are additionally disposed above the lower chamber exhaust passage 164. The lower chamber exhaust passage 164 is configured to remove exhaust gases from the lower chamber 113, while the upper chamber exhaust passage openings 324 are configured to remove exhaust gases from the upper chamber 111.

Figure 3A:
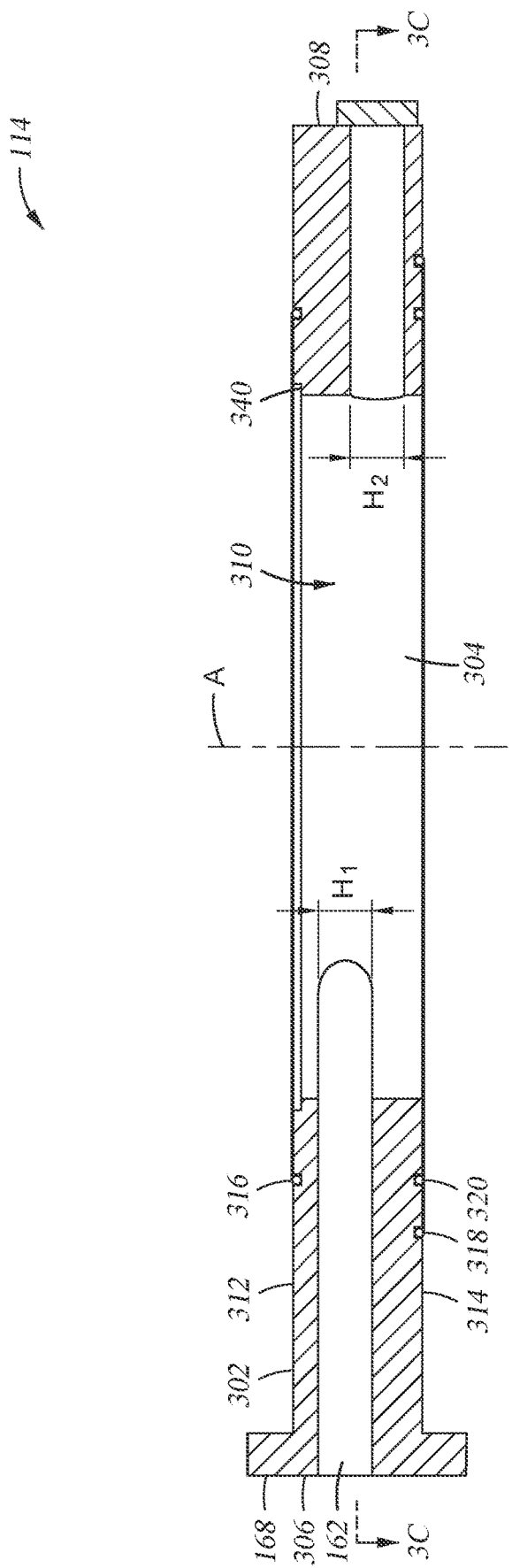
FIG. 3A is a schematic cross sectional view of a base ring, according to embodiments of the present disclosure.

FIG. 3A is a schematic cross sectional view of the base ring 114. The base ring 114 includes a base ring body 302 with an opening 310 disposed therethrough. The opening 310 forms at least part of the process volume 110 of the overall process chamber 100. The opening 310 is sized to allow the substrate and the susceptor assembly 124 to be disposed therein. The opening 310 is formed by the inner surface 304 of the base ring 114. The opening 310 extends from the top surface 312 of the base ring 114 to a bottom surface 314 of the base ring 114.

The base ring body 302 is the body of the base ring 114 and is formed of a metal material, such as steel, aluminum, copper, nickel, or a metal alloy. In some embodiments, the base ring body 302 may be a silicon carbide material or a doped silicon carbide material.

Figure 3B:
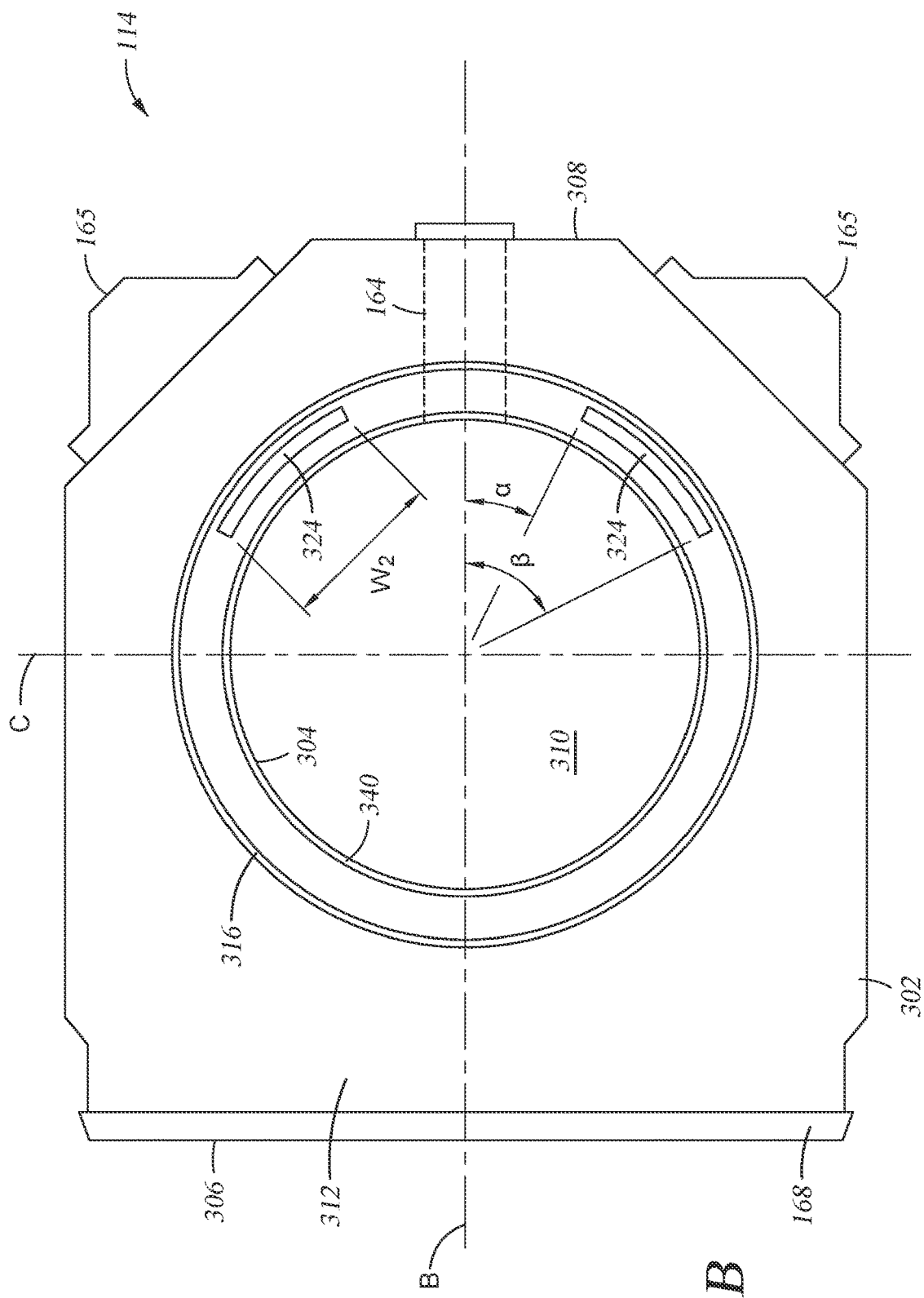
FIG. 3B is a schematic plan view of the base ring of FIG. 3A, according to embodiments of the present disclosure.

As described above the substrate transfer passage 162 is disposed opposite the one or more upper chamber exhaust passage openings 324 and the lower chamber exhaust passage 164. The substrate transfer passage 162 is disposed through a first side 306 of the base ring 114, while the one or more upper chamber exhaust passage openings 324 and the lower chamber exhaust passage 164 are formed through a second side 308 of the base ring 114. The first side 306 of the base ring 114 is disposed on one side of a plane C (FIG. 3C) disposed through the base ring 114, while the second side 308 of the base ring 114 is disposed on an opposite side of the plane C from the first side 306. The plane C passes through the central axis A and is perpendicular to the plane B. The plane C separates the substrate transfer passage 162 from the lower chamber exhaust passage 164 and the upper chamber exhaust passage openings 324. In the embodiment described herein, there are two upper chamber exhaust passage openings 324 formed through the top surface 312 of the base ring 114 (FIG. 3B). The two upper chamber exhaust passage openings 324 are opposite the substrate transfer passage 162, but offset from being directly across from the substrate transfer passage 162. The two upper chamber exhaust passage openings 324 are offset to prevent the inward convergence of gas as it flows across the process volume 110 from the gas injectors 108 (FIG. 1). The gas flow instead remains more evenly distributed across the process volume and enables more uniform deposition on the substrate 150. The two upper chamber exhaust passage openings 324 are disposed inward of a sealing groove 316.

The substrate transfer passage 162 has a height $H_1$ of about 7 mm to about 30 mm, such as about 10 mm to about 20 mm to enable the substrate 150 and a transfer arm (not shown) to be disposed therethrough. The substrate transfer passage 162 further has a width $W_1$ (FIG. 3C) of about 305 mm to about 350 mm, such as about 305 mm to about 315 mm. The width $W_1$ enables substrates 150 to pass therethrough and be placed on the susceptor assembly 124.

Referring additionally to FIG. 1, the lower chamber exhaust passage 164 is disposed across from the substrate transfer passage 162 to put the lower chamber exhaust passage 164 in fluid communication with an exhaust pump (not shown). The exhaust pump may also be coupled to and in fluid communication with both of the upper chamber exhaust passage openings 324. As described herein, the lower chamber exhaust passage 164 is a cylindrical passage or an elliptic passage. The lower chamber exhaust passage 164 has a height $H_2$ of about 0 mm to about 75 mm, such as about 25 mm to about 50 mm. The height $H_2$ of the lower chamber exhaust passage 164 is configured to allow adequate lower chamber gas flow to pass therethrough along with a potential lift arm assembly as shown in FIG. 3A.

Continuing to refer to FIG. 3A, the top surface 312 of the base ring body 302 includes a sealing groove 316 disposed therein. The sealing groove 316 circumscribes the inner surface 304 and is configured to receive a sealing ring, such as an o-ring or other sealing gasket. The sealing ring disposed within the sealing groove 316 may be a polymer or plastic with a hardness of greater than 50 durometer, such as greater than 60 durometer, such as greater than about 65 durometer on the Shore A scale. The sealing groove 316 is sized to receive the sealing ring which forms a seal between the base ring 114 and the inject ring 116 as shown in FIG. 1. The sealing groove 316 is disposed radially outward of the upper chamber exhaust passage openings 324 to prevent exhaust gases flowing through the upper chamber exhaust passage openings 324 from escaping from the process chamber 100.

The top surface 312 optionally includes a support step 340. The support step 340 is a recess formed between the top surface 312 and the inner surface 304. The support step 340 is configured to support the flange 160 (FIG. 1). The flange 160 is configured to be disposed at least partially within the support step 340 of the base ring 114 and the inject ring 116 to hold the flange 160 in place.

The bottom surface 314 of the base ring body 302 includes a first sealing groove 318 and a second sealing groove 320. The first sealing groove 318 and the second sealing groove 320 are concentric and circumscribe the inner surface 304 along the bottom surface 314. The first sealing groove 318 is disposed further outward from the axis A than the second sealing groove 320, such that the first sealing groove 318 circumscribes the second sealing groove 320. Each of the first sealing groove 318 and the second sealing groove 320 are configured to receive a sealing ring, such as an o-ring or other sealing gasket. The sealing ring disposed within the first sealing groove 318 and the second sealing groove 320 may be a polymer or plastic with a hardness of greater than 50 durometer, such as greater than 60 durometer, such as greater than about 65 durometer on the Shore A scale. The first sealing groove 318 and the second sealing groove 320 are sized to receive the sealing ring and enable a seal to be formed between the base ring 114 and the peripheral supports 170 of the lower window 120 as shown in FIG. 1.

Figure 3C:
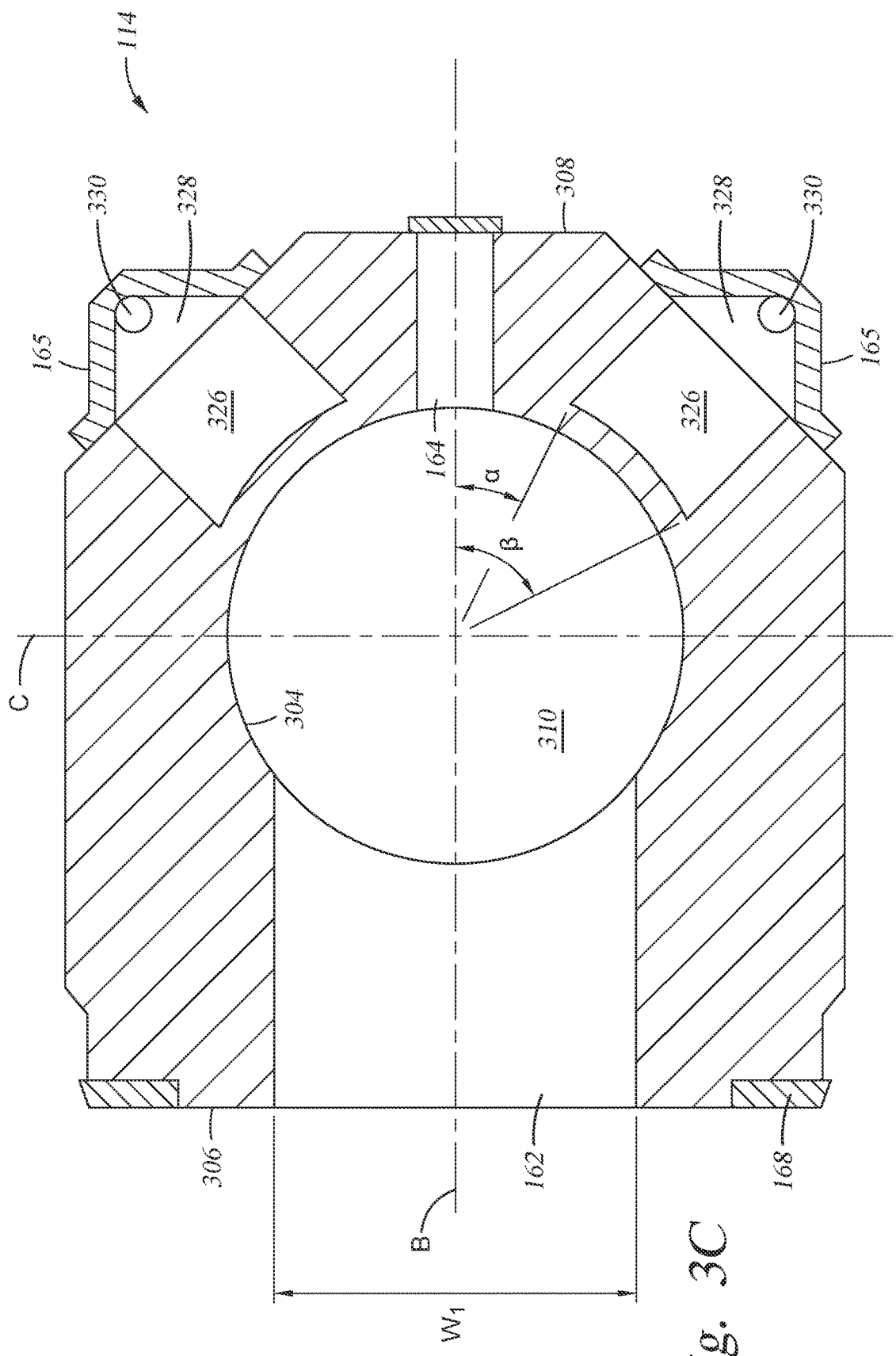
FIG. 3C is a schematic cross sectional plan view of the base ring of FIG. 3A through section line 3C-3C, according to embodiments of the present disclosure.

FIG. 3B is a schematic plan view of the base ring 114 of FIG. 3A. As shown in FIG. 3B, the top surface 312 includes one or more upper chamber exhaust passage openings 324 disposed therethrough. The one or more upper chamber exhaust passage openings 324 are disposed between the inner surface 304 and the sealing groove 316. The one or more upper chamber exhaust passage openings 324 are in fluid communication with a portion of the upper liner 156 and the inject ring 116 to remove process gases from an upper portion of the process volume 110. Each of the one or more upper chamber exhaust passage openings 324 are each in fluid communication with an exhaust module 165 via an upper chamber exhaust passage 326. The upper chamber exhaust passage 326 is a passage disposed through the base ring body 302 (FIG. 3C). The upper chamber exhaust passage 326 fluidly couples one of the exhaust modules 165 to one of the upper chamber exhaust passage openings 324. As shown in FIG. 3B there are two exhaust modules 165 attached to the second side 308 of the base ring body 302. Each of the two exhaust modules 165 are disposed on opposite sides of the lower chamber exhaust passage 164, such that each of the exhaust modules 165 are disposed on opposite sides of and mirrored over a plane B. The plane B passes through the central axis A, the center of the substrate transfer passage 162, and the lower chamber exhaust passage 164 (FIG. 3C). The plane B is a vertically oriented plane and divides the base ring 114 in half, such that the base ring 114 is mirrored across the plane B. The same plane B is utilized with reference to the inject ring 116 as shown in FIG. 4B.

The one or more upper chamber exhaust passage openings 324 each have a width $W_2$ of about 10 mm to about 220 mm, such as about 20 mm to about 150 mm. The width $W_2$ of each of the upper chamber exhaust passage openings 324 enables exhaust gases from within the process volume 110 to be removed while reducing the turbulence of the gas flow within the process volume 110.

Each of the upper chamber exhaust passage openings 324 are disposed between a first exhaust angle α and a second exhaust angle β with respect to the plane B. The first exhaust angle α is an angle of about 5 degrees to about 45 degrees with respect to the plane B, such as about 10 degrees to about 30 degrees with respect to the plane B, such as about 10 degrees to about 25 degrees with respect to the plane B. The first exhaust angle α is large enough to prevent the upper chamber exhaust passage 326 from intersecting the lower chamber exhaust passage 164. The second exhaust angle β is an angle of about 30 degrees to about 70 degrees, such as about 35 degrees to about 65 degrees, such as about 45 degrees to about 60 degrees. The second exhaust angle β is great enough to capture gas directed across the opening 310 by one or more gas injectors 108 without substantial curvature of the gas paths inward towards the plane B. The difference between the first exhaust angle α and the second exhaust angle β is about 25 degrees to about 60 degrees, such as about 30 degrees to about 50 degrees. The different between the first exhaust angle α and the second exhaust angle β enables the upper chamber exhaust passage openings 324 to be disposed around a desired circumference of the opening 310, such that the difference is the amount of the base ring 114 around which the upper chamber exhaust passage openings 324 extend.

FIG. 3C is a schematic cross sectional plan view of the base ring 114 of FIG. 3A taken through section line 3C-3C. As shown in FIG. 3C, each of the upper chamber exhaust passages 326 fluidly connect to an exhaust module passage 328 disposed through each of the exhaust modules 165. The exhaust module passage 328 is in fluid communication with the upper chamber exhaust passage opening 324 via the upper chamber exhaust passage 326. The exhaust module passage 328 narrows as the exhaust module passage 328 extends further from the base ring body 302 until the exhaust module passage 328 is exposed to an exhaust outlet 330. The exhaust outlet 330 is an opening formed through a wall of the exhaust module passage 328 and configured to be coupled to an exhaust conduit (not shown) for removal of the exhaust gas from the process chamber 100. Similarly to the upper chamber exhaust passage openings 324, the upper chamber exhaust passages 326 are disposed between the first exhaust angle α and the second exhaust angle β with respect to the plane B.

Figure 4A:
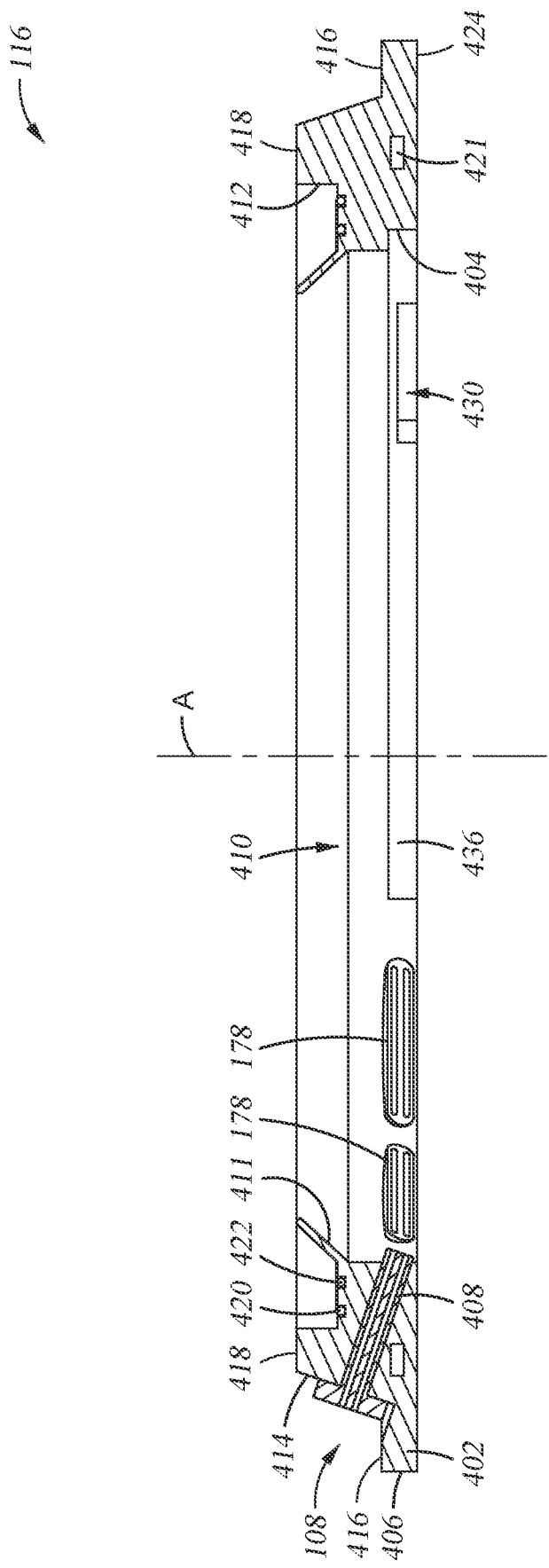
FIG. 4A is a schematic cross sectional view of an inject ring, according to embodiments of the present disclosure.
Figure 4B:
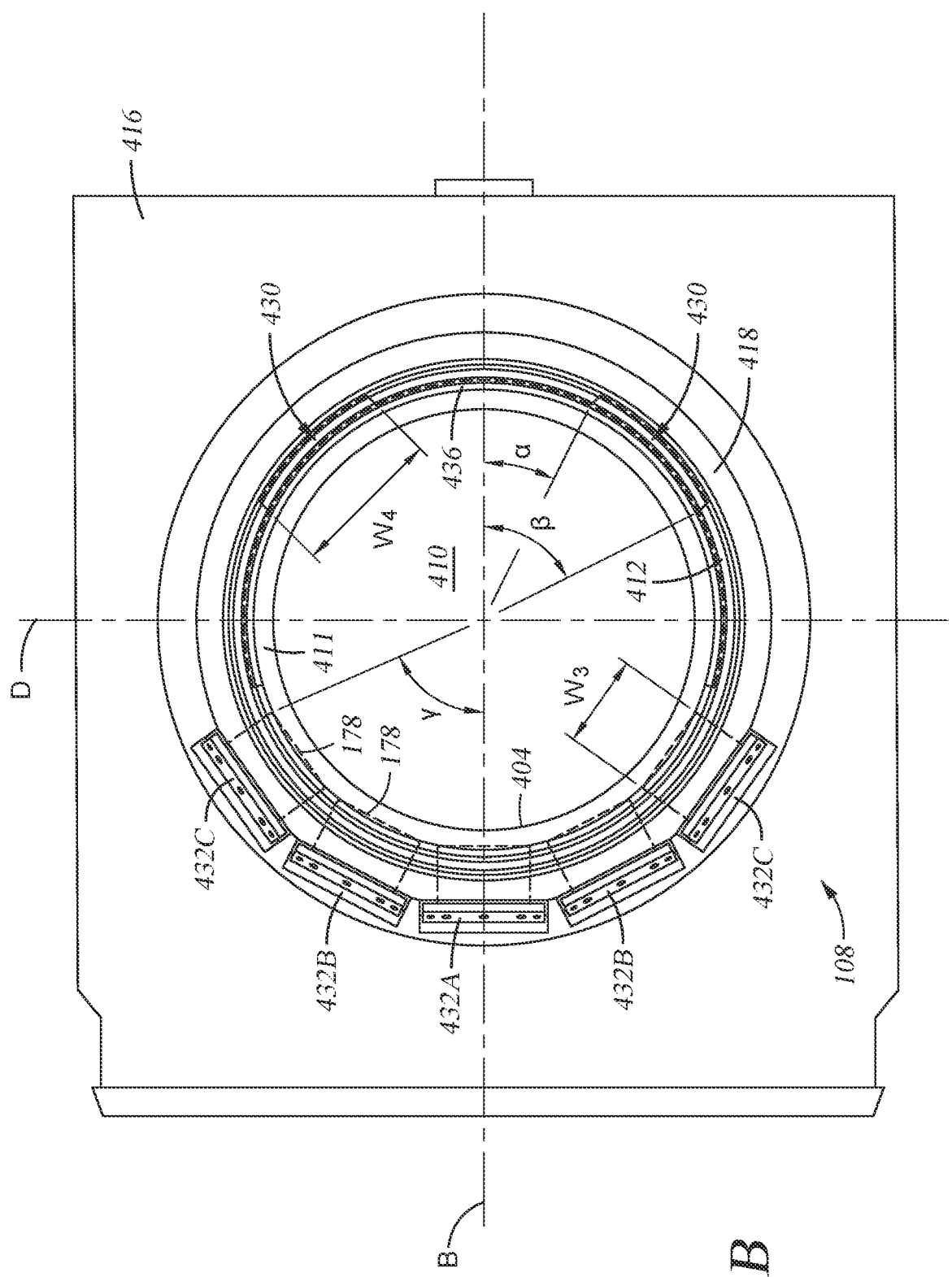
FIG. 4B is a schematic plan view of the inject ring of FIG. 4A, according to embodiments of the present disclosure.

FIG. 4A is a schematic cross sectional view of the inject ring 116, according to embodiments of the present disclosure. The inject ring 116 is configured to sit on top of the base ring 114 and provide process gases to the process volume 110. The inject ring 116 is a separate component from the base ring 114. The inject ring 116 is configured to inject gas across the surface of a substrate, such that the predominant flow of gas through the process volume 110 is in a horizontal direction. The separable inject ring 116 enables the inject ring 116 to be easily replaced and maintained without replacing or removing the entirety of the chamber body assembly 106. This reduces replacement costs and allows for new gas injection improvements to be more easily implemented with the process chamber 100 with minimal impact to other chamber components.

The inject ring 116 includes an inner surface 404 and an outer surface 406. The inner surface 404 forms a ring around an opening 410 disposed within the inject ring 116. The opening 410 forms at least part of the process volume 110 of the process chamber 100. The inject ring 116 includes one or more gas injectors 108 disposed therethrough. The one or more gas injectors 108 extend through an inject ring body 402 from an injector support surface 414 and to the inner surface 404. The one or more gas injectors 108 as described herein are disposed through one or more injector passages 408. Each of the injector passages 408 are sized to receive one of the one or more gas injectors 108, such as one of the gas injectors 108. The injector passages 408 extend from the injector support surface 414 to the inner surface 404. The injector passages 408 extend downward as the injector passages 408 move from the injector support surface 414 to the inner surface 404. Extending downward is defined as the injector passages 408 being disposed further away from a top surface 418 of the inject ring 116 and closer to a bottom surface 424 of the inject ring 116 as the injector passages 408 move radially inward towards the inner surface 404.

The inner surface 404 includes a groove 436 disposed around a majority of the circumference of the inner surface 404, such as greater than 50% of the circumference of the inner surface 404, such as greater 60% of the circumference of the inner surface 404, such as greater than 70% of the circumference of the inner surface 404. The groove 436 is configured to receive a heating element, such as the upper heating element 158. The groove 436 is shown in FIG. 4A as being formed as part of the inner surface 404 and the bottom surface 424 of the inject ring 116. The inner surface 404 also includes two indents 430 disposed therein. The two indents 430 are disposed opposite the injector passages 408. The indents 430 are disposed within the groove 436 and extend deeper into the inject ring body 402 than the groove 436, such that the indents 430 extend further from the axis A than the groove 436.

The injector support surface 414 is a portion of the outer surface 406 of the inject ring body 402 along with an outer stepped surface 416. The injector support surface 414 is configured to hold the one or more gas injectors 108 in place by providing a surface to anchor a portion of the one or more gas injectors 108. The one or more gas outlets 178 are disposed through the inner surface 404 and angled downward towards a substrate 150 disposed within the process volume 110 (FIG. 1).

The bottom surface 424 of the inject ring 116 is configured to contact the top surface 312 of the base ring 114. The bottom surface 424 is a planar surface extending between the outer surface 406 and the inner surface 404. The outer stepped surface 416 extends from the outermost portion of the outer surface 406 to a bottom distal end of the injector support surface 414. The injector support surface 414 extends from the outer stepped surface 416 away from the bottom surface 424. The injector support surface 414 is disposed at an angle to the bottom surface 424. The angle of the injector support surface 414 is at least partially dependent upon the desired downward angle of the injector passages 408 and the one or more gas injectors 108. In embodiments described herein, the angle of the injector support surface 414 with respect to the bottom surface 424 is greater than about 45 degrees, such as about 45 degrees to about 85 degrees, such as about 60 degrees to about 80 degrees, such as about 70 degrees to about 80 degrees. The injector support surface 414 extends radially inward from the outer stepped surface 416, such that the distal end of the injector support surface 414 furthest from the outer stepped surface 416 is closer to the inner surface 404.

The top surface 418 of the inject ring 116 extends radially inward from the upper distal end of the injector support surface 414. The top surface 418 is a horizontal surface, such that the top surface 418 extends parallel to the bottom surface 424. The opposite distal end of the top surface 418 from the injector support surface 414 is attached to a window support trench 412. The window support trench 412 is a channel disposed along the upper surface of the inject ring 116. The window support trench 412 is configured to accept a peripheral support 172 of the upper window 122 therein. The window support trench 412 includes a first window sealing groove 420 and a second window sealing groove 422. Each of the first window sealing groove 420 and the second window sealing groove 422 are configured to receive a sealing ring, such as an o-ring or other sealing gasket. The sealing rings disposed within the first window sealing groove 420 and the second window sealing groove 422 may be a polymer or plastic with a hardness of greater than 50 durometer, such as greater than 60 durometer, such as greater than about 65 durometer on the Shore A scale. The first window sealing groove 420 and the second window sealing groove 422 are sized to receive the sealing ring and enable a seal to be formed between the inject ring 116 and the upper window 122 as shown in FIG. 1.

The inner portion of the window support trench 412 is formed by an angled protrusion 411. The angled protrusion 411 is disposed inward of the first window sealing groove 420 and the second window sealing groove 422. The angled protrusion 411 extends upward from the window support trench 412 and away from the bottom surface 424. The angled protrusion 411 forms a portion of the window support trench 412 disposed on the innermost side of the angled protrusion 411 and a portion of the inner surface 404 on the outermost side of the angled protrusion 411. The angled protrusion 411 extends radially inward while extending upward from the window support trench 412. The angled protrusion 411 shields a portion of the upper window 122, such as the peripheral support 172, from the process volume 110 (FIG. 1). Shielding the peripheral support 172 from the process volume 110 reduces the heating load on the peripheral support 172 and the seals within the first window sealing groove 420 and the second window sealing groove 422. The angled protrusion 411 additionally protects sealing rings disposed within the support trench 412 from being directly exposed to radiant energy or process gases, thus extending the lift and reliability of the sealing rings.

A coolant passage 421 is optionally disposed through the inject ring body 402. The coolant passage 421 is configured to receive a coolant fluid, such as water or oil. The coolant passage 421 is a partial ring disposed through the inject ring body 402 and assists in controlling the temperature of both the inject ring 116 and the base ring 114.

FIG. 4B is a schematic plan view of the inject ring 116 of FIG. 4A having a plurality of gas injectors 108. Five gas injectors 108 are illustrated in FIG. 4B. Other quantities of gas injectors 108 are also envisioned, such as three or more gas injectors 108, four or more gas injectors 108, five or more gas injectors 108, or six or more gas injectors 108. The number of gas injectors 108 determines the number of zones in which the process gases are injected into the process volume 110 (FIG. 1). Each of the gas injectors 108 has a gas outlet directed towards a central portion of the inject ring 116, such as a central axis A. The gas injectors 108 are disposed on one side of the inject ring 116 to enable a cross flow across a substrate within the process chamber 100. The group of gas injectors 108 are centered about the plane B. The plane B is the same plane B which passes through the base ring 114. The plane B is disposed through the central axis A and is perpendicular to a plane D. Each of the gas injectors 108 may have a plurality of individual process gas passages disposed therein (FIGS. 5A-6B). In embodiments wherein five gas injectors 108 are utilized, a central gas injector 432a forms an inner gas inject zone, two outermost gas injectors 432c form an outer gas inject zone, and two intermediate gas injectors 432b between the central gas injector 432a and the outermost gas injectors 432c form an intermediate gas inject zone. The plane B is disposed through the central gas injector 432a. The two intermediate gas injectors 432b are mirrored across the plane B. Similarly, the two outermost gas injectors 432c are mirrored across the plane B. Each of the injector passages 408 have a gas injector 108 disposed therethrough. The number of injector passages 408 is equal to the number of gas injectors 108.

Each of the injector passages 408 have an injector passage width $W_3$. The injector passage width $W_3$ of each of the injector passages 408 is shown as being the same. In alternative embodiments, the injector passage width $W_3$ varies as the injector passages 408 extend outward from a central gas injector 432a to the outermost gas injectors 432c. In some embodiments, the injector passage width $W_3$ of the injector passages 408 through which the outermost gas injectors 432c extend is greater than the injector passage width $W_3$ of the injector passages 408 through which the intermediate gas injectors 432b extend. The injector passages 408 through which the intermediate gas injectors 432b extend has a greater inject passage width $W_3$ than the injector passage width $W_3$ of the injector passage 408 through which the central gas injector 432a extends.

Alternatively, the injector passage widths $W_3$ are reduced as the injector passages 408 extend outward from the injector passage 408 through which the central gas injector 432a is disposed. In this embodiment, the injector passage width $W_3$ of the injector passages 408 through which the outermost gas injectors 432c extend is less than the injector passage width $W_3$ of the injector passages 408 through which the intermediate gas injectors 432b extend. The inject passage width $W_3$ of the injector passages 408 through which the intermediate gas injectors 432b extend is less than the injector passage width $W_3$ of the injector passage 408 through which the central gas injector 432a extends.

Each of the injector passages 408 are disposed at an injector angle γ with respect to the plane B. The injector angle γ is taken with respect to the plane B, but on the opposite side of the plane D with respect to the first exhaust angle α and the second exhaust angle β. The injector angle γ is less than about 90 degrees, such as less than about 70 degrees from the plane B, such as less than about 65 degrees from the plane B, such as less than about 60 degrees from the plane B. The injector angle γ is configured to be within 10 degrees of the second exhaust angle β, such that the difference between the injector angle γ and the second exhaust angle β is about −10 degrees to about 10 degrees, such as about −5 degrees to about 5 degrees, such as about 0 degrees. The injector angle γ and the second exhaust angle β are similar to reduce deflection of gases injected into the process volume 110 by the gas injectors 108 as the gases are exhausted. Deflecting the gases may cause non-uniformities in film deposition.

The inject ring 116 includes indents 430 within the inner surface 404 opposite the injector passages 408. The indents 430 correspond to the one or more upper chamber exhaust passage openings 324 (FIG. 3B). The indents 430 are disposed over the one or more upper chamber exhaust passage openings 324, such that the indents 430 serve as a first portion of the one or more upper chamber exhaust passages 326 of the base ring 114 (FIG. 4A). In the embodiment described herein, there are two indents 430 which correspond to two upper chamber exhaust passages 326. The two indents 430 are disposed on an opposite side of the opening 410 from the injector passages 408. The two indents 430 are disposed on one side of a plane D which passes through the inject ring 116, while the injector passages 408 are disposed on the opposite side of the plane D. The two indents 430 are offset from the center of the inject ring 116 across from the injector passage 408 through which the central gas injector 432a is disposed. Neither of the indents 430 are disposed through the plane B. The indents 430 are mirrored across the plane B. As described above, offsetting the two indents 430 prevents the inward convergence of gas as it flows across the process volume 110 from the gas injectors 108 (FIG. 1) and to the upper chamber exhaust passages 326.

As described herein, the indents 430 are similar in size and shape to the one or more upper chamber exhaust passage openings 324. Each of the indents 430 have a width $W_4$ of about 0 mm to about 220 mm, such as about 10 mm to about 150 mm. The width $W_4$ corresponds to the width $W_2$ of the upper chamber exhaust passage openings 324 (FIG. 3B). The width $W_4$ is configured to reduce the disruption of gas flow within the process volume 110 to allow for primarily laminar gas flow and uniform deposition on the substrate 150. Similarly to the upper chamber exhaust passage openings 324, the indents 430 are disposed between the first exhaust angle α and the second exhaust angle β with respect to the plane B.

The inject ring body 402 forms the inject ring 116 and is formed of a metal material, such as steel, aluminum, copper, nickel, or a metal alloy. In some embodiments, the inject ring body 402 may be fabricated from a silicon carbide material or a doped silicon carbide material.

Figure 5A:
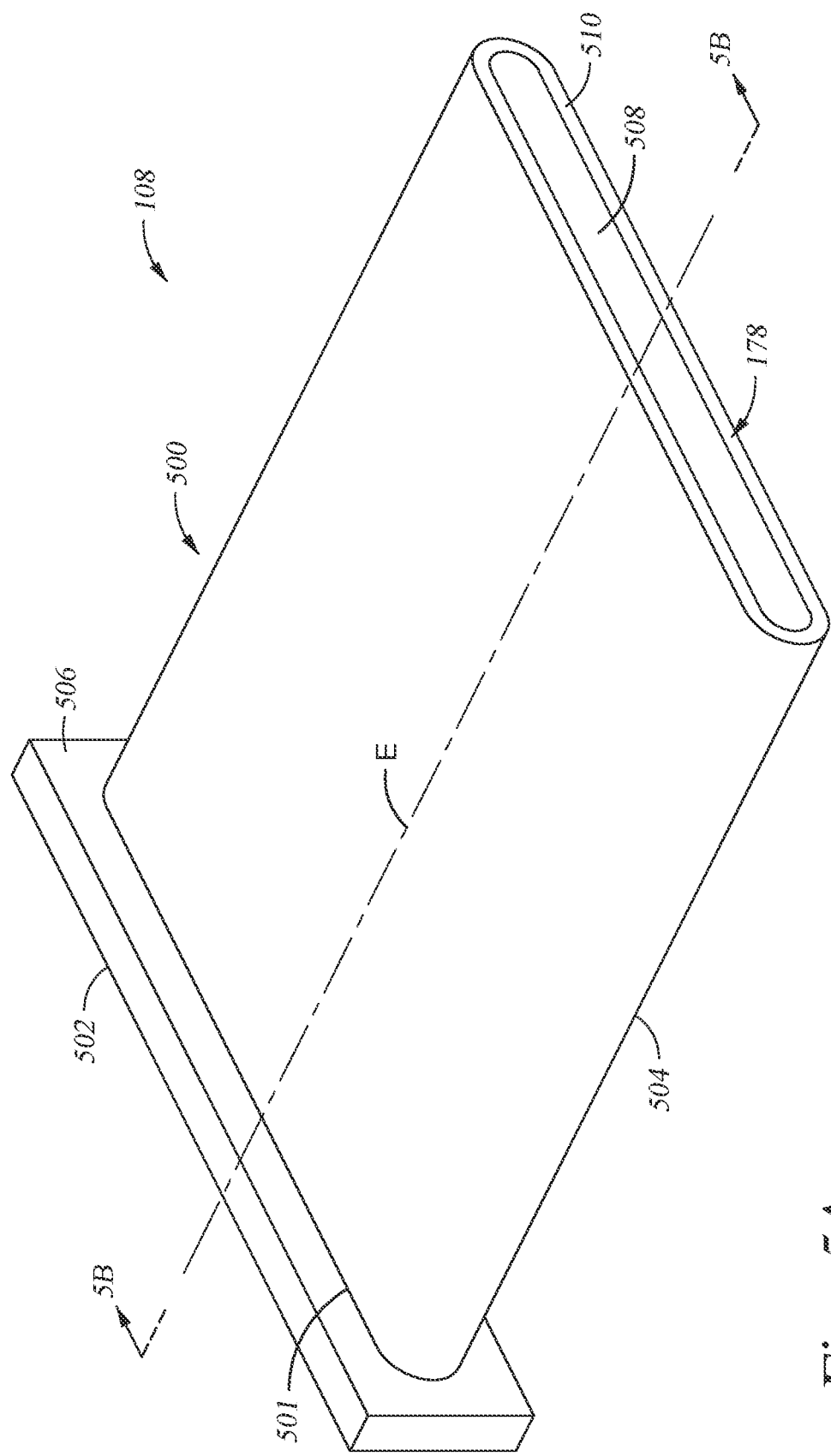
FIG. 5A is a schematic isometric view of a gas injector, according to embodiments of the present disclosure.

FIG. 5A is a schematic isometric view of the gas injector 108, according to one embodiment of the present disclosure. The gas injector 108 includes an injector base body 502 and an injector insert 500. The injector insert 500 is connected to the injector base body 502 and configured to be fitted into one of the injector passages 408 (FIG. 4A). The injector base body 502 is configured to rest on the injector support surface 414 and secure the injector insert 500 in place within one of the injector passages 408. The gas injector 108 is configured to create a plurality of gas paths within the injector 108 and provide a sheet of gas leaving a gas outlet 178 disposed in a distal end of the injector insert 500 opposite the injector base body 502.

The injector insert 500 and the injector base body 502 are both formed of a material with low reactivity to process gases, high durability, and high thermal conductivity. Materials suitable for formation of the injector base body 502 and the injector insert 500 include silicon carbide, nickel, stainless steel, aluminum, and quartz.

The injector insert 500 extends from a back surface 506 of the injector base body 502. The back surface 506 acts as a mounting surface to secure the gas injector 108 to the injector support surface 414. The back surface 506 is a planar surface disposed around a base 501 of the injector insert 500. The injector insert 500 includes an outer surface 504 and an inject surface 510. The gas outlet 178 is disposed through the inject surface 510. The inject surface 510 is disposed on a distal end of the injector insert 500 opposite the base 501 and the injector base body 502. The outer surface 504 of the injector insert 500 is configured to fit inside of one of the injector passages 408. The cross section of the outer surface 504 of the injector insert 500 and the inject surface 510 are a stadium shape or an obround shape. In some embodiments, the cross section of the outer surface 504 and the inject surface 510 is an oval or quadrilateral, such as a rectangle, a parallelogram, or a trapezoid. Other shapes for the cross section of the outer surface 504 and the inject surface 510 are also envisioned and may be effective.

The gas outlet 178 of the injector insert 500 is formed from an outlet opening 508. The outlet opening 508 is disposed through the inject surface 510 of the injector insert 500. The outlet opening 508 is shaped to distribute gas driven through the outlet opening 508 to form a sheet of gas directed across the top surface of the substrate 150.

Figure 5B:
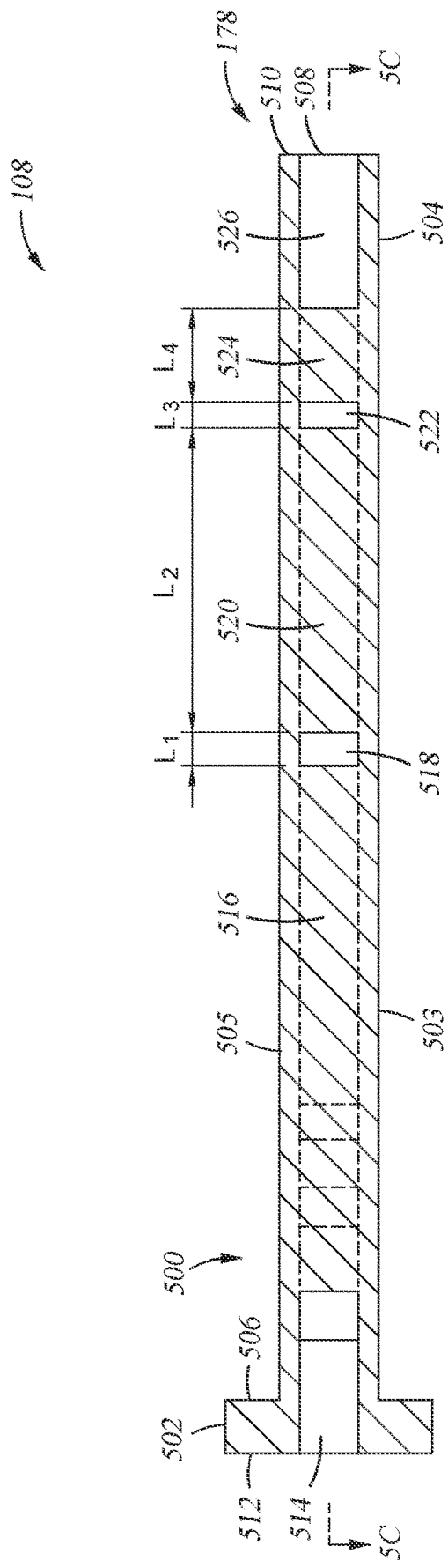
FIG. 5B is a schematic cross sectional view of the gas injector of FIG. 5A through the section line 5B-5B, according to embodiments of the present disclosure.

FIG. 5B is a schematic cross sectional view illustration of the gas injector 108 of FIG. 5A taken through section line 5B-5B, according to embodiments of the present disclosure. The injector base body 502 includes a front surface 512. The front surface 512 is a side of the injector base body 502 opposite the back surface 506. The front surface 512 is configured to receive one or more gas connections and one or more electrical connections. The one or more gas connections may be either of the first process gas supply source 174 and/or the second process gas supply source 176. The one or more electrical connections are not shown, but may be configured to supply power to a heater disposed within the gas injector 108.

Figure 5C:
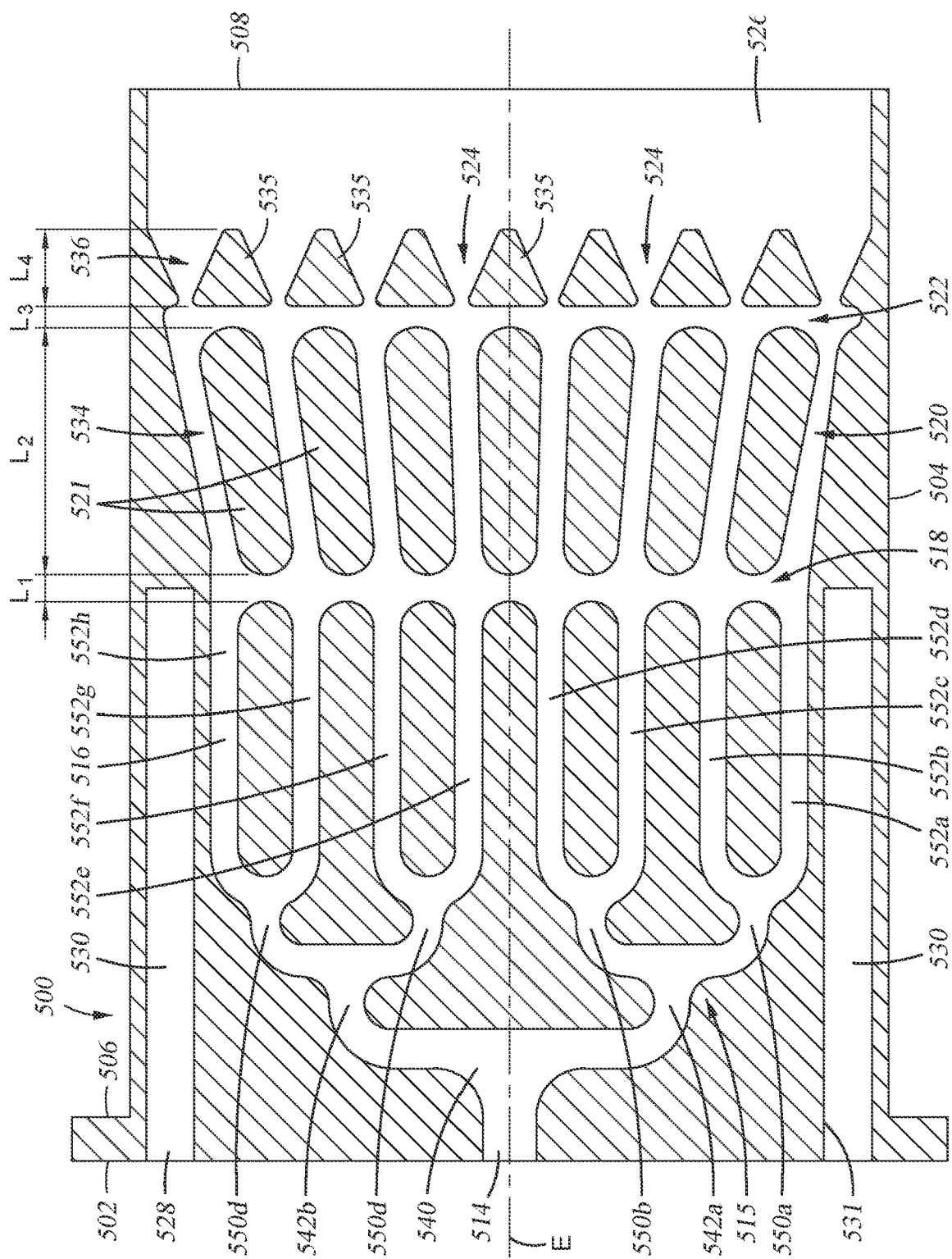
FIG. 5C is a schematic cross sectional plan view of the gas injector of FIG. 5A through the section line 5C-5C, according to embodiments of the present disclosure.

A gas introduction passage 514 is disposed through the front surface 512. The gas introduction passage 514 is a single gas passage and is configured to transfer a process gas from a gas line coupled to the front surface 512 to a diffusion passage 516 disposed within the injector insert 500. The diffusion passage 516 splits the gas stream from the gas introduction passage 514 into a plurality of gas streams. The diffusion of the gas into the plurality of gas streams may be gradual or abrupt, such that in some embodiments the single gas introduction passage 514 is split into three or more passages simultaneously while in other embodiments, the single gas introduction passage 514 is split into two gas passages, which split into four gas passages, which split into eight gas passages (FIG. 5C).

Therefore, the diffusion passage 516 is a gas distribution network of gas pathways or a gas distribution tree. The gradual split of the gas within the diffusion passage 516 as shown in FIG. 5C enables the pressure of the gas within each of the gas passages to be equalized across the direction of flow and therefore improves the uniformity of gas distribution within the diffusion passage 516 across a plurality of individual pathways 552a-h (FIG. 5C). Different configurations of the diffusion passage 516 are utilized to alter the gas distribution across each of the pathways 552a-h. In the example depicted in FIG. 5C, the diffusion passage 516 includes a first split 540 extending from the gas introduction passage into two arms of the diffusion passage 516. After the diffusion passage 516 is split into two arms at the first split 540, each of the two arms are split into two additional arms at two second splits 542a, 542b. After splitting at the two second splits 542a, 542b there are four total arms extending toward the outlet opening 508. Each of the four arms is then split into two additional arms at four third splits 550a, 550b, 550c, 550d. After splitting at the four third splits 550a, 550b, 550c, 550d, there are eight total arms extending toward the outlet opening 508. In some embodiments, each of the first split 540, the second splits 542a, 542b, or the third splits 550a, 550b, 550c, 550d may alternatively split into three or four additional arms instead of two additional arms. In yet other embodiments, one of the second splits 542a, 542b or the third splits 550a, 550b, 550c, 550d may not be utilized, such that there are only two sets of splits or a single set of splits.

The individual pathways 552a-h may be configured to provide greater gas flow through some pathways 552a-h versus other pathways 552a-h. The size of the injector insert 500 and the number of individual gas pathways 552a-h are also adjusted for different configurations of the injector insert 500 and different processes. There are 4 to 16 pathways formed by the diffusion passage 516, such as 4 to 12 pathways, such as 6 to 10 pathways, such as 8 pathways. The cross sectional size of each pathway 552a-h within the diffusion passage 516 is selected depending on the desired flow rate, flow velocity, flow pressure, and/or the types of gases desired for a given process.

The use of the gas injectors 108 is beneficial in that new injection passage designs may be quickly and cheaply tested within process chambers with little downtime and significantly reduced cost of production. New injection path designs may be tested with the replacement of one or more of the gas injectors 108 without disassembly or replacement of other components within the process chamber 100, such as the inject ring 116 or the base ring 114. Therefore, the gas injectors 108 enable rapid adaptation of new diffusion passage 516 and injector insert 500 designs. Different gas injectors 108 may also be utilized for distributing process gases to different portions of the substrate 150. The overall length of the gas injectors could be about 75 mm to about 150 mm, such as about 80 mm to about 120 mm, such as about 100 mm. Different gas injector 108 lengths are utilized for different reasons, such that the delivery of gases to the edges of the substrate may be biased verses the delivery of gases to the center of the substrate.

Each of the pathways 552a-h of the diffusion passage 516 open into a first plenum 518. The first plenum 518 is a volume disposed at a distal end of the diffusion passage 516 opposite from the pas introduction passage 514. The first plenum 518 is a single volume at the distal end of each of the pathways 552a-h of the diffusion passage 516. The first plenum 518 enables the pressure and flow velocity between each gas stream traveling through one of the individual pathways 552a-h to be at least partially equalized. Equalizing the pressure within the first plenum 518 allows the flow rate between each of the pathways 551a-h to be at least partially equalized as a backpressure is created within the first plenum 518 and the gases within the gas streams are mixed. The first plenum 518 is configured to partially equalize the pressure between each of the individual pathways 552a-h. The amount of diffusion of the gas streams within the first plenum 518 is controlled by the length $L_1$ of the first plenum 518 between the distal end of the diffusion passage 516 and a distal end of a fin array 520 closest to the diffusion passage 516. The first plenum 518 has a length $L_1$ of about 3 mm to about 12 mm, such as about 3 mm to about 10 mm.

The fin array 520 includes a plurality of fins 521 disposed between a bottom surface 503 and a top surface 505 of the injector insert 500. The plurality of fins 521 are distributed to form a plurality of pathway extensions 534. The pathway extensions 534 are formed between either an inner wall of the injector insert 500 and one of the fins 521 or two adjacent fins 521. In embodiments described herein there are 3 to 14 fins 521, such as 4 to 12 fins 521, such as 6 to 8 fins 521. The fins form the pathway extensions 534, such that there are 4 to 16 pathway extensions 534, such as 6 to 12 pathway extensions 534, such as 8 pathway extensions 534. In embodiments described herein there are the same number of pathway extensions 534 as pathways 552a-h, so that the gas streams are not disrupted and continue after passing through the first plenum 518. Each of the fins 521 within the fin array 520 are individually oriented in a different direction. In the example depicted in FIG. 5C, the fins 521 have a fan-shaped arrangement, and are oriented at an increasing angle from a centerline E of the inject ring 116. Each fin 521 disposed further away from the centerline E is oriented at a greater angle relative to the centerline E (FIG. 5C). The fin on the centerline E is linearly aligned with the centerline E.

The fin array 520 is disposed over a length $L_2$ of the injector insert 500. The length $L_2$ of the fin array 520 assists in determining the flow vector and distribution of each of the gas streams. Longer lengths $L_2$ reduce the velocity of the gas streams and increase the backpressure within the first plenum 518. Reduced lengths $L_2$ do not allow for adequate backpressure buildup or gas mixing. The length $L_2$ of the fin array 520 is about 15 mm to about 50 mm, such as about 20 mm to about 40 mm. In some embodiments the length $L_2$ is about 25% to about 50% of the overall width $W_5$ of the injector insert 500.

Immediately downstream of the fin array 520 is a second plenum 522. The second plenum 522 is a volume disposed at a distal end of the fin array 520 opposite from the first plenum 518. The second plenum 522 is a single volume at the distal end of each of the pathway extensions 534 of the fin array 520. The second plenum 522 enables the pressure and flow velocities between each gas stream traveling through one of the individual pathway extensions 534 to be at least partially equalized. Equalizing the pressure within the second plenum 522 allows the flow rate between each of the pathway extensions 534 to be at least partially equalized. A backpressure is created within the second plenum 522 and the gases within the gas streams are mixed. The second plenum 522 is configured to partially equalize the pressure between each of the pathway extensions 534. The amount of diffusion of the gas streams within the second plenum 522 and the buildup of the backpressure is controlled in part by the length $L_3$ of the second plenum 522 between the distal end of the fin array 520 and a distal end of a baffle array 524 closest to the second plenum 522. The second plenum 522 has a length $L_3$ of about 3 mm to about 12 mm, such as about 3 mm to about 10 mm.

The baffle array 524 is formed from a plurality of baffles 535 (FIG. 5C). The baffles 535 of the baffle array 524 form a plurality of pathway exits 536. The pathway exits 536 are an additional extension of each of the pathways 552a-h and the pathway extensions 534. The pathway exits 536 are narrow pathways adjacent to the second plenum 522 and widen as the pathway exits 536 extend away from the second plenum 522 and towards a third plenum 526. The plurality of baffles 535 are shaped to have a surface adjacent the second plenum 522 which is wider across the direction of gas flow than a surface adjacent the third plenum 526. In some embodiments, each of the baffles 535 are trapezoidal in shape, such as an isosceles trapezoid. Other shapes for the baffles 535 are also contemplated. In embodiments described herein, there are 3 to 14 baffles 535 within the baffle array 524, such as 4 to 12 baffles, such as 5 to 10 baffles, such as 6 to 8 baffles.

The shape and orientation of each of the baffles 535 assists in equalizing the pressure between each of the gas streams passing through the second plenum 522 by creating a backpressure within the second plenum 522. The backpressure within the second plenum 522 slows the gas flow through the injector insert 500 and assists in creating uniform gas streams through the pathway exits 536. The expansion of the width of each of the pathway exits 536 encourages expansion of each stream of gas to fill the third plenum 526. Therefore, the baffle array 524 assists in creating a curtain of process gas disposed across the width of the third plenum 526. The curtain of process gas is configured to be a near-uniform curtain with the flow rate and concentration of the process gases being the same throughout the width of the third plenum 526.

The baffle array 524 is disposed over a length $L_4$ of the injector insert 500. The length $L_4$ of the baffle array 524 assists in determining the expansion rate of the gas streams, the backpressure within the second plenum 522, and the rate of gas mixing. The length $L_4$ of the baffle array 524 is about 25% to about 50% of the length $L_2$ of the fin array 520, such as about 30% to about 40% of the length $L_2$, such as about 30% to about 35% of the length $L_2$.

The third plenum 526 is disposed between the baffle array 524 and the outlet opening 508. The third plenum 526 is an open region formed within the walls of the injector insert 500. The third plenum 526 is configured to allow the streams of gas flown out of the baffle array 524 to mix and merge into a continuous sheet of process gas. The sheet of process gas is then released into the process volume 110 through the outlet opening 508.

FIG. 5C is a schematic cross sectional plan view illustration of the gas injector 108 of FIG. 5A taken through section line 5C-5C, according to embodiments of the present disclosure. FIG. 5C more clearly illustrates the distribution system 515 through the injector insert 500 as discussed above. The distribution system 515 includes the gas introduction passage 514, the diffusion passage, the first plenum 518, the fin array 520, the second plenum 522, the baffle array 524, the third plenum 526, and the passageways formed therefrom.

Disposed on opposite sides of the injector insert 500 are one or more heating elements 530. The heating elements 530 are disposed through at least a portion of the injector insert 500 and around the diffusion passage 516. The heating elements 530 described herein are inserted into the injector insert 500 through one or more openings 528 disposed through the front surface 512 of the injector base body 502. The heating elements 530 may be one of a resistive heating element or a radiative heating element. The heating elements 530 shown in FIG. 5C are cartridge heaters and are placed inside of a heater cavity 531. In the embodiment of FIGS. 5A-5C there are two heater cavities 531 with a single heating element 530 disposed in each of the heater cavities 531.

The heating elements 530 disposed within each of the gas injectors 108 enables pre-heating of gas mixtures or process gases flowing into the process volume 110 (FIG. 1). The gas injectors 108 being heated separately from the other components of the process chamber 100, such as the inject ring 116 and the base ring 114, enables more controlled heating of gases flowed through the gas injectors 108. The gases may be heated to a desired process temperature immediately before entering the process volume using the heating elements 530 described herein. Heating the gas injectors 108 is generally utilized when flowing stable or unreactive precursors through the gas injectors 108, such as dichlorosilane or trichlorosilane. The heating elements 530 are configured to heat the gas injectors 108 and the gas flowed through the gas injectors 108 to a temperature of less than about 400° C., such as about 100° C. to about 400° C., such as about 150° C. to about 300° C., such as about 200° C. to about 300° C. Individual heating of each of the gas injectors 108 further enables process gas flown through each individual gas injector 108 to be controlled, such that process gases flown through one or more of the gas injectors 108 is heated to a different temperature than the process gases flown through another of the gas injectors 108. The heating elements 530 enable preheating of the gas without immature consumption of the gas before being flowed over the substrate.

Figure 5D:
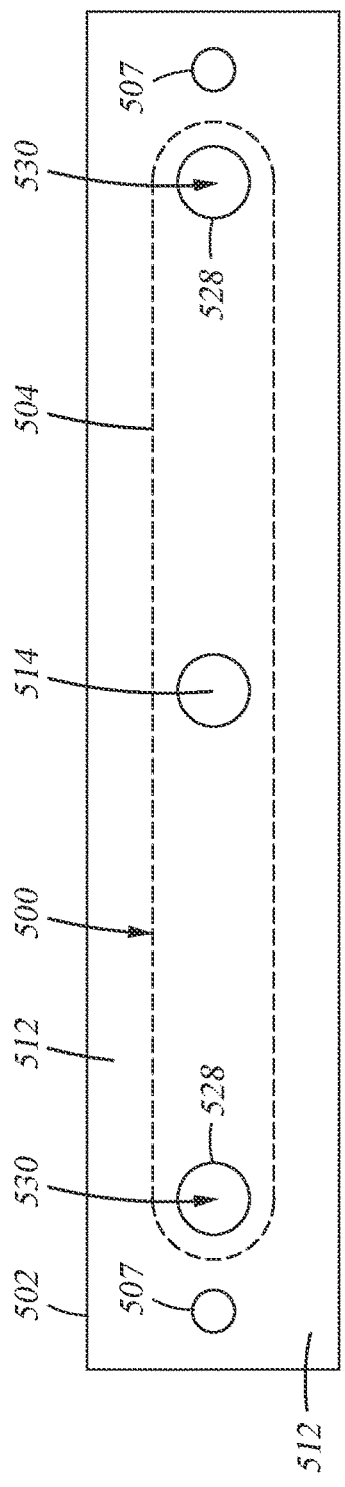
FIG. 5D is a schematic side view of the gas injector of FIG. 5A from a first side, according to embodiments of the present disclosure.

FIG. 5D is a schematic side view of the gas injector 108 of FIG. 5A from a first side, according to embodiments of the present disclosure. The gas injector 108 is shown facing the front surface 512 of the injector base body 502. Disposed through the front surface 512 is the gas introduction passage 514, the one or more openings 528 for the heating elements 530, and one or more mounting fasteners 507. The gas introduction passage 514 is disposed between the openings 528, such that the gas introduction passage 514 is centered between the openings 528. There are two openings 528 shown and a heating element 530 is disposed within each of the openings 528. Each of the openings 528 and the gas introduction passage 514 are disposed inward of an outer surface 504 of the injector insert 500.

The one or more mounting fasteners 507 are used to mount the gas injector 108 to the inject ring 116 and hold the gas injector 108 in place. The one or more mounting fasteners 507 may include a hook, a clasp, a securing pin, a latch, a screw, or a bolt. Other fastener types are also envisioned. The one or more mounting fasteners 507 are disposed through the injector base body 502. The one or more mounting fasteners 507 are disposed through as least the front surface 512. The one or more mounting fasteners 507 as shown herein are two mounting fasteners 507. The two mounting fasteners 507 are disposed on opposite sides of the injector base body 502 and on opposite sides of the gas introduction passage 514. The two mounting fasteners 507 are disposed outward of the openings 528 disposed through the injector base body 502.

In some embodiments, additionally heating elements 530 or mounting fasteners 507 are utilized. The openings 528 disposed through the front surface 512 enable the heating elements 530 to be independently coupled to a power source (not shown). The gas introduction passage 514 enables a gas supply source, such as one of the first process gas supply source 174 or the second process gas supply source 176, to be fluidly coupled to and supply process gas to the diffusion passage 516.

Figure 5E:
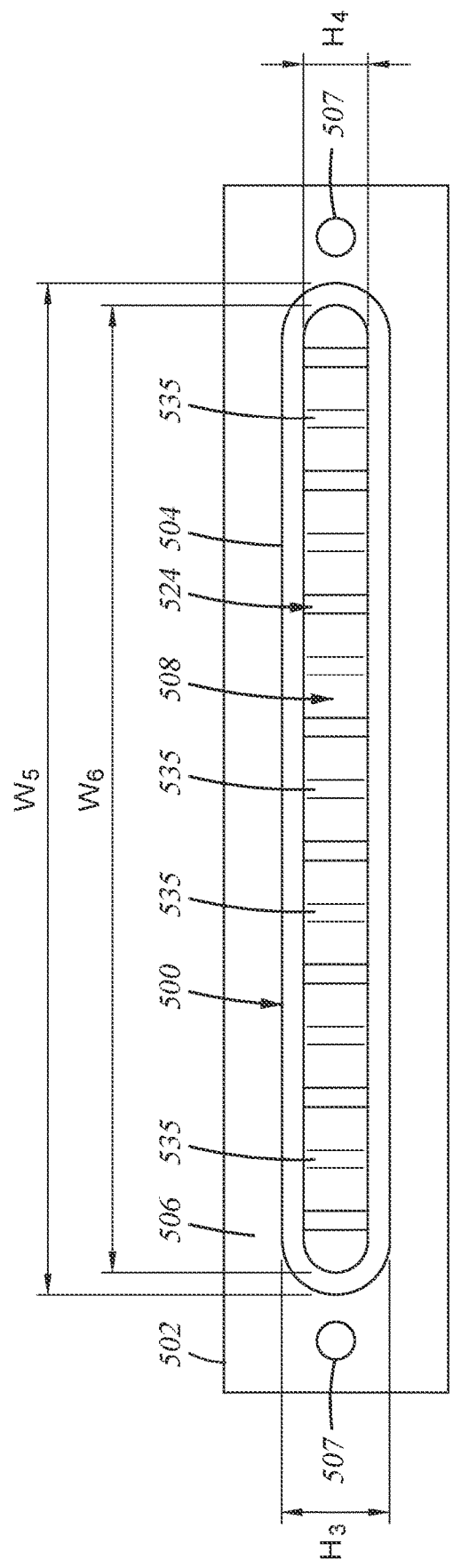
FIG. 5E is a schematic side view of the gas injector of FIG. 5A from a second side, according to embodiments of the present disclosure.

FIG. 5E is a schematic side view of the gas injector 108 of FIG. 5A from a second side, according to embodiments of the present disclosure. The gas injector 108 is shown facing the inject surface 510 of the injector insert 500. As shown, the outlet opening 508 is disposed within the inject surface 510. The one or more mounting fasteners 507 are further disposed through the injector base body 502.

The height $H_3$ of the inject surface 510 and therefore the height of the injector insert 500 is about 5 mm to about 12 mm, such as about 6 mm to about 11 mm, such as about 7 mm to about 10 mm. The height $H_3$ is similar to the height of the injector passages 408 and enables the injector insert 500 to be inserted into the injector passages 408. The width $W_5$ of the inject surface 510 and therefore the width of the injector insert 500 is about 50 mm to about 100 mm, such as about 60 mm to about 90 mm, such as about 70 mm to about 90 mm. The width $W_5$ is similar to the width of the injector passages 408 and enables the injector insert 500 to be inserted into the injector passages 408. The width $W_5$ further determines the number of gas injectors 108 utilized in the process chamber 100. The ratio of the height $H_3$ to the width $W_5$ of the inject insert 500 is about 1:15 to about 1:5, such as about 1:12 to about 1:8, such as about 1:10. The ratio of the height $H_3$ to the width $W_5$ assists in the formation of a uniform sheet of gas leaving the injector insert 500.

The outlet opening 508 of the gas injector 108 includes a width $W_6$ of about 50 mm to about 100 mm, such as about 70 mm to about 90 mm. The width $W_6$ of the outlet opening 508 is configured to control the distribution of gas from a single gas injector 108. The width $W_6$ may be wider when less gas injectors 108 are utilized or narrower when more gas injectors 108 are utilized. The height $H_4$ of the outlet opening 508 is about 2 mm to about 8 mm, such as about 3 mm to about 7 mm, such as about 3 mm to about 6 mm. The height $H_4$ of the outlet opening 508 is equal to the height of the rest of the distribution system 515. In some embodiments, the height $H_4$ varies throughout the distribution system 515.

Figure 6A:
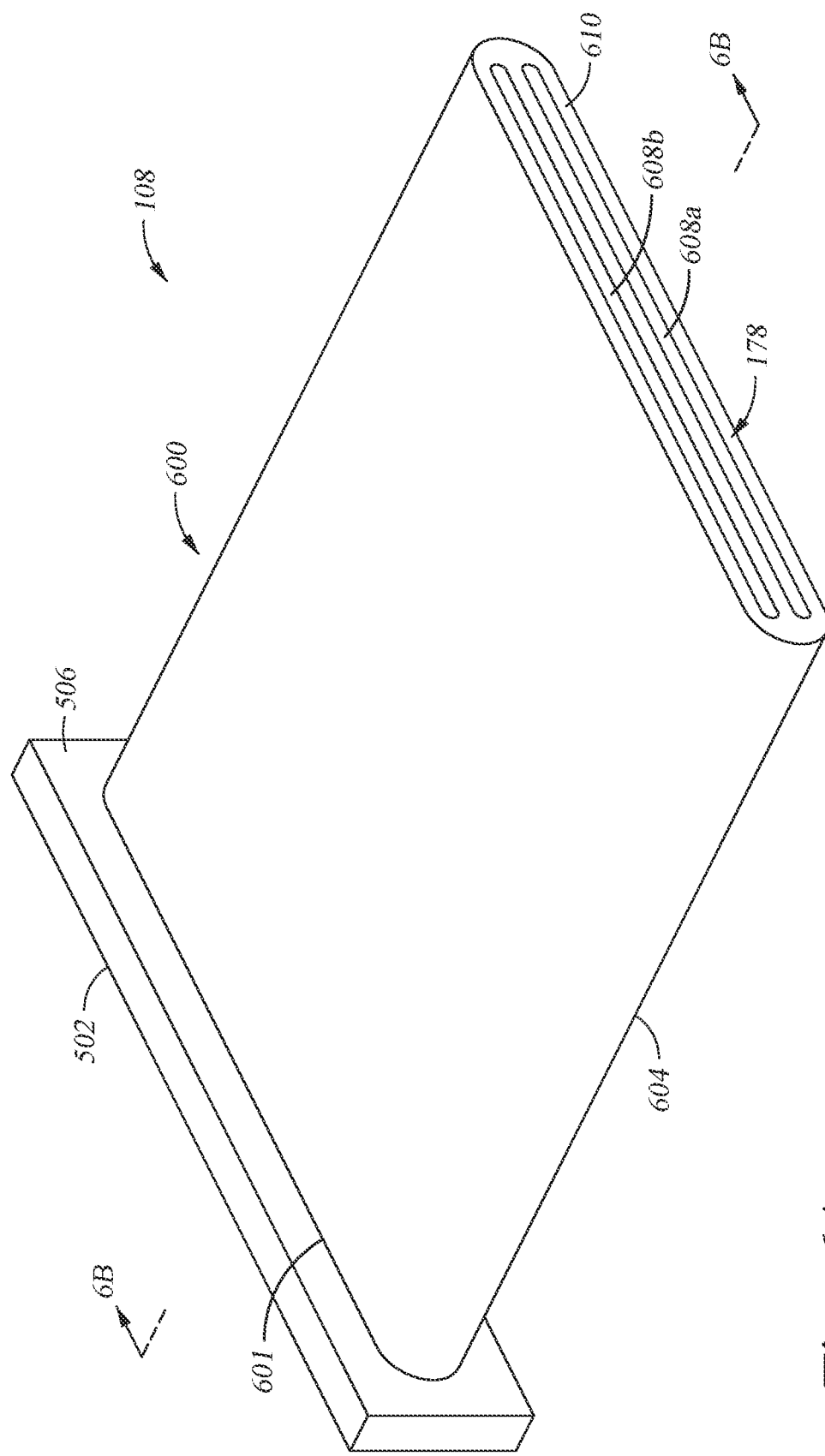
FIG. 6A is a schematic isometric view of another embodiment of a gas injector, according to embodiments of the present disclosure.
Figure 6B:
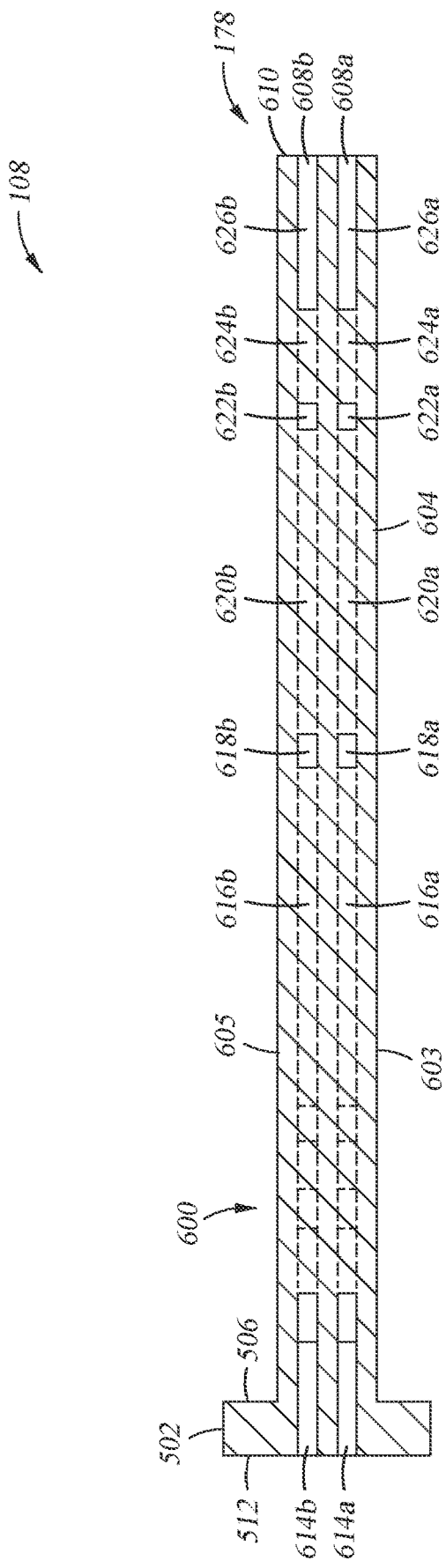
FIG. 6B is a schematic cross sectional view of the gas injector of FIG. 6A through the section line 6B-6B, according to embodiments of the present disclosure.

FIG. 6A is a schematic isometric view of another embodiment of a gas injector 108, according to a second embodiment of the present disclosure. The gas injector 108 of FIGS. 6A-6B is similar to the gas injector 108, but the injector insert 500 is replaced to be a multi-tiered injector insert 600. The multi-tiered injector insert 600 is similar to the injector insert 500 of FIG. 5A-5C, but has two tiers of gas flow, such that a first sheet of gas flow is disposed below a second sheet of gas flow. The injector insert 600 includes two distribution systems 515, such that a first distribution system 515 is stacked on top of a second distribution system 515 as described herein.

The gas injector 108 of FIGS. 6A-6B includes the injector base body 502 and the multi-tiered injector insert 600. The multi-tiered injector insert 600 is connected to the injector base body 502 and configured to be fitted into one of the injector passages 408 (FIG. 4A) in a similar manner to the injector insert 500 of FIGS. 5A-5C. Each gas injector 108 having the injector insert 600 includes a first outlet opening 608a and a second outlet opening 608b within the gas outlet 178, such that there are two separate and distinct gas outlets disposed in a distal end of the multi-tiered injector insert 600 opposite the injector base body 502. Each of the first outlet opening 608a and the second outlet opening 608b are supplied with separate process gases from separate process gas sources, such as the first process gas supply source 174 and the second process gas supply source 176.

The multi-tiered injector insert 600 and the injector base body 502 are both formed of a material with low reactivity to process gases, high durability, and high thermal conductivity. Materials which are suitable for formation of the injector base body 502 and the multi-tiered injector insert 600 include silicon carbide, nickel, stainless steel, aluminum, and quartz.

The multi-tiered injector insert 600 extends from a back surface 506 of the injector base body 502. The multi-tiered injector insert 600 includes an outer surface 604 and an inject surface 610. The gas outlet 178 is disposed through the inject surface 610. The inject surface 610 is disposed on a distal end of the multi-tiered injector insert 600 opposite a base 601 of the multi-tiered injector insert 600 and the injector base body 502. The outer surface 604 of the multi-tiered injector insert 600 is configured to fit inside of one of the injector passages 408. The cross section of the outer surface 604 of the multi-tiered injector insert 600 and the inject surface 610 are a stadium shape or an obround shape. In some embodiments, the cross section of the outer surface 604 and the inject surface 610 is an oval or quadrilateral, such as a rectangle, a parallelogram, or a trapezoid. Other shapes for the cross section of the outer surface 604 and the inject surface 610 are also envisioned and may be effective. The multi-tiered injector insert 600 includes a top surface 605 and a bottom surface 603 of the outer surface 604. The top surface 605 and the bottom surface 603 are similar to the top surface 505 and the bottom surface 503.

The gas outlet 178 of the injector insert 600 includes the first outlet opening 608a and the second outlet opening 608b. The first outlet opening 608a and the second outlet opening 608b are disposed through the inject surface 610 of the multi-tiered injector insert 600. Each of the first outlet opening 608a and the second outlet opening 608b are shaped to distribute gas driven through the first outlet opening 608a and the second outlet opening 608b to form two sheets of gas across a surface of a substrate. In the embodiment of FIGS. 6A-6B the first outlet opening 608a is disposed below the second outlet opening 608b. The first outlet opening 608a is disposed parallel to the second outlet opening 608b. Each of the first outlet opening 608a and the second outlet opening 608b are configured to provide separate gas curtains or sheets.

Each separate gas sheet may be dispensed parallel to one another and mix only after entering the process volume 110 (FIG. 1). The paths of each of the gas sheets are separated while being flowed through the injector insert 600. In some embodiments one or both of the first outlet opening 608a and the second outlet opening 608b are disposed to direct the gas leaving the first outlet opening 608a or the second outlet opening 608b towards the gas stream leaving the opposite outlet opening 608a, 608b. This may enhance gas mixing between the two curtains of process gas leaving the outlet openings 608a, 608b.

FIG. 6B is a schematic cross sectional view illustration of the gas injector 108 of FIG. 6A taken through section line 6B-6B, according to embodiments of the present disclosure. In embodiments described herein, there is a first gas introduction passage 614a and a second gas introduction passage 614b. The one or more gas connections coupled to the first gas introduction passage 614a and the second gas introduction passage 614b may be either of the first process gas supply source 174 or the second process gas supply source 176. In some embodiments, the first gas introduction passage 614a is coupled to the first process gas supply source 174 and the second gas introduction passage 614b is coupled to the second process gas supply source 176. Both the first gas introduction passage 614a and the second gas introduction passage 614b are similar to the gas introduction passage 514 of FIG. 5B and FIG. 5C.

Each of the first gas introduction passage 614a and the second gas introduction passage 614b are separate and distinct gas passages. The first gas introduction passage 614a is a single gas passage, which transfers a process gas from a gas line coupled to the front surface 512. The second gas introduction passage 614b is similar to the first gas introduction passage 614a and is a single gas passage, which transfers a second process gas from a second line coupled to the front surface 512. The first gas introduction passage 614a is configured to be in fluid communication with a first diffusion passage 616a. The second gas introduction passage 614b is in fluid communication with a second diffusion passage 616b disposed within the multi-tiered injector insert 600. The first diffusion passage 616a and the second diffusion passage 616b are both similar to the diffusion passage 516 of FIG. 5C. The first diffusion passage 616a and the second diffusion passage 616b may have different patterns in some embodiments, such that the pattern of the first diffusion passage 616a is different from the pattern of the second diffusion passage 616b. The first diffusion passage 616a is disposed below the second diffusion passage 616b.

There are 4 to 16 pathways formed by each of the first diffusion passage 616a and the second diffusion passage 616b, such as 4 to 12 pathways, such as 6 to 10 pathways, such as 8 pathways.

Each of the pathways of the first diffusion passage 616a open into a first lower plenum 618a. Each of the pathways of the second diffusion passage 616b open into a first upper plenum 618b. The first lower plenum 618a and the first upper plenum 618b are two separate volumes disposed at a distal end of the first diffusion passage 616a and the second diffusion passage 616b respectively. The first lower plenum 618a and the first upper plenum 618b are similar to the first plenum 518 of FIGS. 5B and 5C. A lower fin array 620a is disposed at a distal end of the first lower plenum 618a opposite the first lower plenum 618a from the first diffusion passage 616a. An upper fin array 620b is disposed at a distal end of the first upper plenum 618b. Each of the lower fin array 620a and the upper fin array 620b are similar to the fin array 520 of FIGS. 5B and 5C and each include a plurality of fins.

Immediately downstream of the lower fin array 620a is a second lower plenum 622a. Immediately downstream of the upper fin array 620b is a second upper plenum 622b. The second lower plenum 622a and the second upper plenum 622b are volumes disposed at a distal end of the lower fin array 620a and the upper fin array 620b respectively. The second lower plenum 622a and the second upper plenum 622b are similar to the second plenum 522 of FIGS. 5B and 5C.

A lower baffle array 624a and an upper baffle array 624b are formed from a plurality of baffles similar to the baffles 535 of FIG. 5C. The lower baffle array 624a is disposed at the distal end of the second lower plenum 622a furthest from the lower fin array 620a. The upper baffle array 624b is disposed at the distal end of the second upper plenum 622b furthest from the upper fin array 620b. A third lower plenum 626a and a third upper plenum 626b extend from the lower baffle array 624a and the upper baffle array 624b respectively. The third lower plenum 626a is a volume extending between the lower baffle array 624a and the first outlet opening 608a. The third upper plenum 626b is a volume extending between the upper baffle array 624b and the second outlet opening 608b. Each of the third lower plenum 626a and the third upper plenum 626b are similar to the third plenum 526.

Although not shown in FIGS. 6A and 6B, the multi-tiered injector insert 600 further includes one or more heating elements similar to the heating elements 530 of FIG. 5C. The pattern and distribution of the passages, plenums, fins, and baffles within the multi-tiered injector insert 600 is similar to that described above with respect to the embodiment of FIGS. 5A-5C. There may also be three or more tiers within the multi-tiered injector insert 600 as space permits. In some embodiments, there are three tiers for injecting three separate gas sheets into the process volume 110 or four tiers for injecting four separate gas sheets into the process volume 110.

FIG. 6C is a schematic side view of the gas injector 108 of FIG. 6A from a first side, according to embodiments of the present disclosure. The gas injector 108 is shown facing the front surface 512 of the injector base body 502. Similarly to as discussed above with reference to FIG. 5D, the gas injector 108 includes one or more openings 528 for heating elements 530 and one or more mounting fasteners 507. The gas introduction passage 514 is replaced with a first gas introduction passage 614a and a second gas introduction passage 614b. The second gas introduction passage 614b is disposed above the first gas introduction passage 614a. Both of the first gas introduction passage 614a and the second gas introduction passage 614b are disposed between the openings 528 and the heating elements 530. The first gas introduction passage 614a and the second gas introduction passage 614b are within the outer surface 604 of the multi-tiered injector insert 600. The height of the multi-tiered injector insert 600 may be adjusted to compensate for the additional tier of gas passages, or each gas passage may be narrowed.

FIG. 6D is a schematic side view of the gas injector of FIG. 6A from a second side, according to embodiments of the present disclosure. The gas injector 108 is shown facing the inject surface 610 of the multi-tiered injector insert 600. As shown, the first outlet opening 608a and the second outlet opening 608b are disposed within the inject surface 610.

The height $H_5$ of the inject surface 610 and therefore the height of the injector insert 600 is about 5 mm to about 15 mm, such as about 6 mm to about 12 mm, such as about 8 mm to about 12 mm. The height $H_5$ is similar to the height of the injector passages 408 and enables the injector insert 600 to be inserted into the injector passages 408. The width $W_5$ of the inject surface 610 is similar to the width $W_5$ of the inject surface 510. The width $W_5$ is similar to the width of the injector passages 408 and enables the injector insert 600 to be inserted into the injector passages 408. The ratio of the height $H_5$ to the width $W_5$ of the inject surface 610 is about 1:7 to about 1:20, such as about 1:8 to about 1:16, such as about 1:10 to about 1:15. The ratio of the height $H_5$ to the width $W_5$ assists in the formation of uniform sheets of gas leaving the injector insert 600.

The width $W_6$ of each of the first outlet opening 608a and the second outlet opening 608b are similar to the width $W_6$ of the outlet opening 508. Each of the first outlet opening 608a and the second outlet opening 608b further include a height $H_6$. The height $H_6$ is about 2 mm to about 8 mm, such as about 3 mm to about 7 mm, such as about 3 mm to about 6 mm. The height $H_6$ of the outlet openings 608a, 608b is equal to the height of the rest of each of the distribution systems 515. In some embodiments, the height $H_6$ varies throughout the distribution system 515.

Figure 7A:
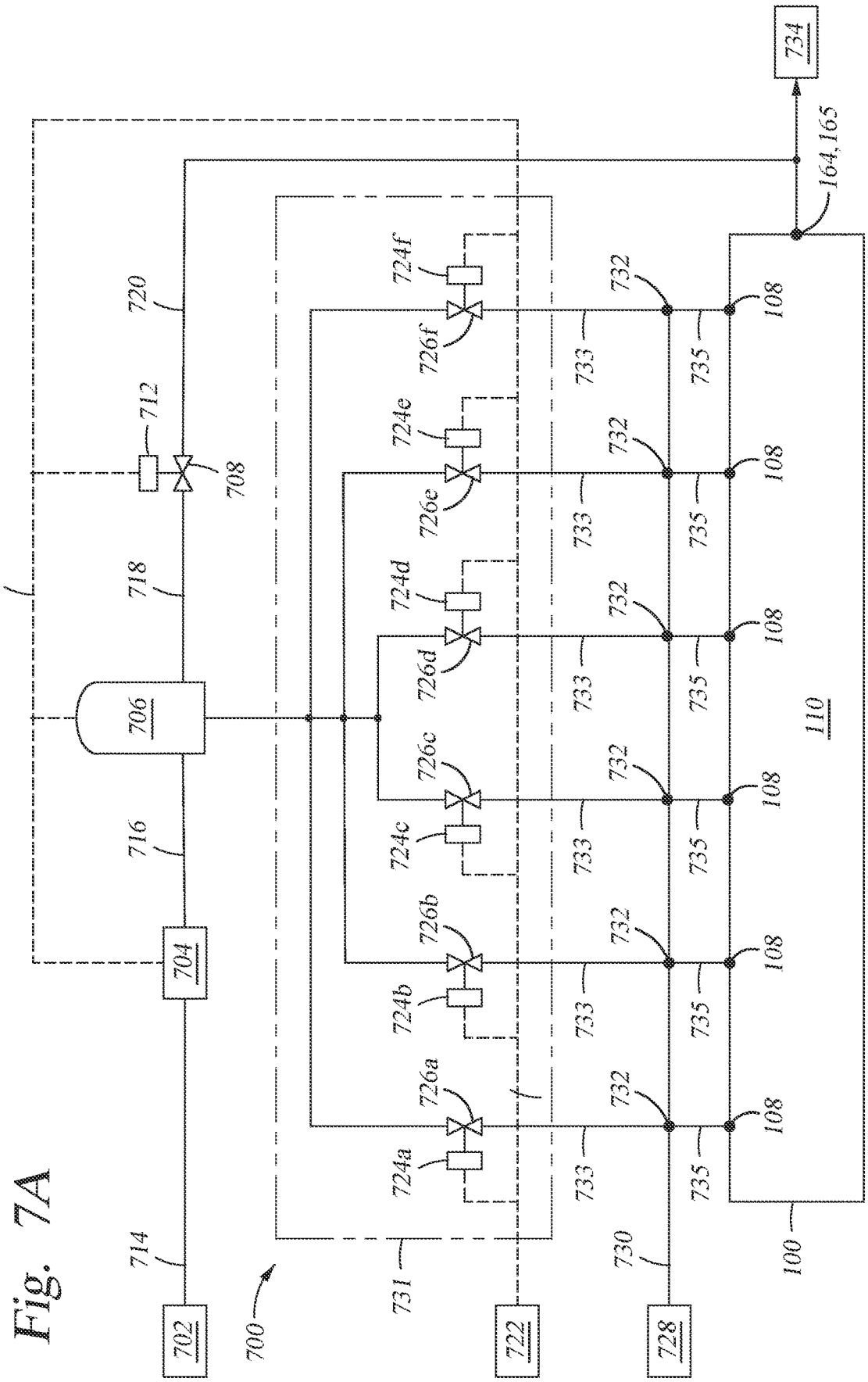
FIG. 7A is a schematic gas flow diagram of a gas mixture assembly, according to embodiments of the present disclosure.

FIG. 7A is a schematic gas flow diagram of a gas delivery assembly 700, according to embodiments of the present disclosure. The gas delivery assembly 700 may be used in place of or along with one of the first process gas supply source 174 and the second process gas supply source 176. The gas delivery assembly 700 is configured to supply process gases to the process volume 110 via the gas injectors 108. The gas delivery assembly 700 assists in controlling the partial pressure and flow rate of precursors into the process volume 110 from a process gas source 702. Controlling the partial pressure of the gas from the process gas source 702 allows for the concentration of process gases flowing into different regions of the process volume 110 to be controlled. The gas delivery assembly 700 enables the flowrate and the partial pressure (i.e., concentration) of process gases and precursors flown through different arms of the gas delivery assembly 700 to be independently controlled. A user can configure different arms or conduits of the gas delivery assembly 700 to deliver the same flow rate, but with different partial pressures/concentrations of specific process gases.

The gas delivery assembly 700 includes the process gas source 702 fluidly coupled to a pressure controller 704, a gas reservoir 706 fluidly coupled to the pressure controller 704, and an exhaust divert valve 708 fluidly coupled to and disposed between the gas reservoir 706 and an exhaust pump 734. A plurality of splitter valves 726a-726f are fluidly connected to the gas reservoir 706 and the process volume 110. The plurality of splitter valves 726a-726f are coupled to the gas reservoir 706 in parallel. Each of the splitter valves 726a-726f of the plurality of splitter valves 726a-726f are coupled to a valve controller 724a-724f. The valve controllers 724a-724f control the volumetric flow rate through each of the splitter valves 726a-726f from the gas reservoir 706.

A carrier gas source 728 is fluidly coupled to a plurality of mixing points 732. The plurality of mixing points 732 are disposed between the carrier gas source 728 and the process volume 110 as well as between the plurality of splitter valves 726a-726f and the process volume 110. The gases from the splitter valves 726a-726f and the carrier gas source 728 are combined at the mixing points 732 before delivery to the gas injectors 108.

The process gas source 702 may be a gas panel or a single process gas source 702. The process gas source 702 is configured to supply a process gas, such as a silicon containing gas, a germanium containing gas, a nitrogen containing gas, a carbon containing gas, or an oxygen containing gas. Other types of process gases are also contemplated. The process gas source 702 is configured to supply the process gas at a predetermined concentration and flow rate, such that the mass flow rate of components within the process gas are controlled by the process gas source 702. The process gas source 702 is fluidly coupled to the pressure controller 704 via a process gas conduit 714. The pressure controller 704 is configured to control the pressure of the gas stored within the gas reservoir 706. The pressure controller 704 controls the pressure within the gas reservoir 706. The pressure controller 704 controls the flow of process gas through the pressure controller 704 and the exhaust divert valve 708 to account for gases leaving the gas reservoir 706 into the process volume 110.

The pressure controller 704 is fluidly coupled to the gas reservoir 706 by a reservoir supply conduit 716. The reservoir supply conduit 716 transfers gases between the pressure controller 704 and the gas reservoir 706. The gas reservoir 706 is a pressurized gas reservoir. The gas reservoir 706 is held at a pressure of about 10 psi to about 65 psi, such as about 10 psi to about 60 psi, such as about 14 psi to about 50 psi. The gas reservoir 706 is configured to maintain a constant pressure. The constant pressure assists in controlling the pulsing of process gas through the splitter valves 726a-726f. The gas reservoir 706 is a chamber or tank and is configured to hold greater than about 100 $cm^3$ of process gas therein during substrate processing operations. The gas reservoir 706 has a volume of about 100 $cm^3$ to about 750 $cm^3$, such as about 100 $cm^3$ to about 500 $cm^3$. The gas reservoir 706 is large enough to enable homogeneous mixing of gases introduced therein by the process gas source 702. The gas reservoir 706 may be configured to allow a flow rate of about 100 sccm to about 500 sccm to pass continuously therethrough.

If the pressure within the gas reservoir 706 goes above a predetermined limit, the pressure controller 704 communicates with the exhaust divert valve 708 via an exhaust valve controller 712. The exhaust valve controller 712 is coupled to the exhaust divert valve 708 and opens or closes the exhaust divert valve 708 to increase or decrease bleeding of the process gas from the gas reservoir 706 to the exhaust pump 734. The exhaust pump 734 is coupled to the exhaust divert valve 708 via an exhaust conduit 720. The exhaust conduit 720 also fluidly couples the exhaust modules 165 and the lower chamber exhaust passage 164 to the exhaust pump 734.

The exhaust divert valve 708 allows process gas from the gas reservoir 706 to be exhausted to the exhaust pump 734 while each of the splitter valves 726a-726f are closed. The flow rate of the process gas exhausted through the exhaust divert valve 708 while all of the splitter valves 726a-726f are closed is equal to the desired flow rate of the process gas flown through each of the splitter valves 726a-726f. When the splitter valves 726a-726f are in an open position and allowing process gas to pass into the process volume 110, the exhaust divert valve 708 is closed. The combination of the splitter valves 726a-726f and the exhaust divert valve 708 being opened or closed provides fast gas delivery times with little to no ramping of rates and pressures. The combined flow through each of the splitter valves 726a-726f and the exhaust divert valve 708 with respect to time is controlled to be nearly constant using a master flow controller 722.

Each of the splitter valves 726a-726f are coupled to the gas reservoir 706 via a splitter conduit 725. The splitter conduit 725 is configured to branch into a plurality of gas lines and connect to each of the splitter valves 726a-726f. Each of the splitter valves 726a-726f are coupled in parallel, such that none of the splitter valves 726a-726b are in a same gas flow path. The plurality of splitter valves 726a-726f includes a first splitter valve 726a, a second splitter valve 726b, a third splitter valve 726c, a fourth splitter valve 726d, a fifth splitter valve 726e, and a sixth splitter valve 726f. Each of the splitter valves 726a-726f are configured to control the flow of process gases passing therethrough from the splitter conduit 725. Each of the splitter valves 726a-726f are controlled by one of the valve controllers 724a-724f. The valve controllers 724a-724f are coupled to the master flow controller 722. The master flow controller 722 is configured to provide instructions to each of the valve controllers 724a-724f. Each of the valve controllers 724a-724f are configured to control the configuration of the splitter valves 726a-726f, such that each of the valve controllers 724a-724f are configured to open and close one of the splitter valves 726a-726f. The splitter valves 726a-726f enable the flow rate or partial pressure (i.e., concentration) of the process gases flown through each branch of the splitter valve assembly 731 to be controlled before mixing with a carrier gas at the mixing points 732. Therefore, the flow rate out of each of the gas injectors 108 may be the same while the partial pressure of the process gas within the gas flow out of the gas injectors 108 may be varied between each of the gas injectors 108. The partial pressure of the process gas through each of the gas injectors 108 may further be varied during the same process within a process chamber, such that the concentration of the process gas through each gas injector 108 changes as a single substrate is processed.

A first valve controller 724a is configured to open or close the first splitter valve 726a. A second valve controller 724b is configured to open or close the second splitter valve 726b. A third valve controller 724c is configured to open or close the third splitter valve 726c. A fourth valve controller 724d is configured to open or close the fourth splitter valve 726d. A fifth valve controller 724e is configured to open or close the fifth splitter valve 726e. A sixth valve controller 724f is configured to open or close the sixth splitter valve 726f. Each of the splitter valves 726a-726f are able to be opened and closed to varying degrees to partially restrict or allow process gas flow through one of the splitter valves 726a-726f. Flow is increased through one or more of the splitter valves 726a-726f by opening the splitter valve 726a-726f. Flow is decreased through one or more of the splitter valves 726a-726f by at least partially closing the one or more splitter valves 726a-726f.

Although shown as having six splitter valves 726a-726f and six valve controllers 724a-724f, other numbers of splitter valves 726a-726f and valve controllers 724a-724f are also contemplated. In some embodiments, there are 2 to 20 splitter valves 726a-726f, such as 3 to 15 splitter valves 726a-726f, such as 4 to 12 splitter valves 726a, 726f, such as 4 to 10 splitter valves 726a-726f, such as 4 to 8 splitter valves 726a-726f, such as 4 to 6 splitter valves 726a-726f. In the embodiments shown in FIGS. 1, 2A, 2B, 4A, and 4B, there are five splitter valves 726a-726f. Similarly, there may be 2 to 20 valve controllers 724a-724f, such as 3 to 15 valve controllers 724a-724f, such as 4 to 12 valve controllers 724a-724f, such as 4 to 10 valve controllers 724a-724f, such as 4 to 8 valve controllers 724a-724f, such as 4 to 6 valve controllers 724a-724f. In the embodiments shown in FIGS. 1, 2A, 2B, 4A, and 4B, there are five valve controllers 724a-724f.

The flow through some of the splitter valves 726a-726f may be controlled to be less than the flow through others of the splitter valves 726a-726f. In some embodiments, each of the splitter valves 726a-726f and the corresponding valve controllers 724a-724f are considered a splitter valve assembly 731.

Gas is flown through each of the splitter valves 726a-726f and into a plurality of split gas conduits 733. A split gas conduit 733 extends from each of the splitter valves 726a-726f and to a mixing point 732 of the plurality of mixing points 732. The gas flow through each of the split gas conduits 733 is combined with a carrier gas at the mixing points 732. The carrier gas is provided by the carrier gas source 728. The carrier gas is provided from the carrier gas source 728 to each of the mixing points 732 via a carrier gas conduit 730. The carrier gas conduit 730 may include a similar splitter valve assembly to the splitter valve assembly 731 described above. Alternatively, the carrier gas conduit 730 is split into a plurality of carrier gas lines. One of the carrier gas lines connects to each of the mixing points 732. The carrier gas supplied by the carrier gas source 728 may be any one or a combination of helium (He), nitrogen ($N_2$), hydrogen ($H_2$), argon (Ar), or oxygen ($O_2$). Other carrier gases are also envisioned. In some embodiments, the carrier gas source 728 is replaced with a second process gas source.

After the process gas is combined with the carrier gas at one of the mixing points 732 into a single combined gas, the combined gas is provided to each of the one or more gas injectors 108 for injection through the gas injectors 108 into the process volume 110. Individual mixed gas conduits 735 extend between each of the mixing points 732 and to each of the corresponding gas injectors 108.

Each of the valve controllers 724a-724f are coupled to the master flow controller 722. Each of the valve controllers 724a-724f are coupled to the master flow controller 722 either using one or more electrical connections or are linked using an electronic or radio frequency (RF) signal. The master flow controller 722 is additionally coupled to each of the pressure controller 704, the gas reservoir 706, and the exhaust valve controller 712. The master flow controller 722 is configured to send and receive instructions to each of the valve controllers 724a-724f, the pressure controller 704, the gas reservoir 706, and the exhaust valve controller 712 to control the flow of process gases into the process volume 110.

Each of the splitter valves 726a-726f and the exhaust divert valve 708 are configured to control flow of a process gas through conduits disposed within the gas delivery assembly 700. The types of valves which may make up the splitter valves 726a-726f and the exhaust divert valve 708 include rotary valves, linear valves, and self-actuated valves. More specifically, the splitter valves 726a-726f and the exhaust divert valve 708 may be one of a ball valve, a plug valve, a butterfly valve, a gate valve, a globe valve, a pinch valve, a diaphragm valve, or a needle valve. The type of valve is chosen at least partially due to the degree of precision used while distributing process gas throughout the gas delivery assembly 700.

The gas delivery assembly 700 enables both the flow rate of the mixed gas entering the process volume 110 as well as the concentration/partial pressure of the process gas within the mixed gas to be controlled. Controlling both the concentration/partial pressure of the process gas as well as the total flow rate enables for the distribution of the process gas across the surface of a substrate to be varied. The controlled concentration of process gas enables greater control of the deposition rate over different regions of a substrate.

Figure 7B:
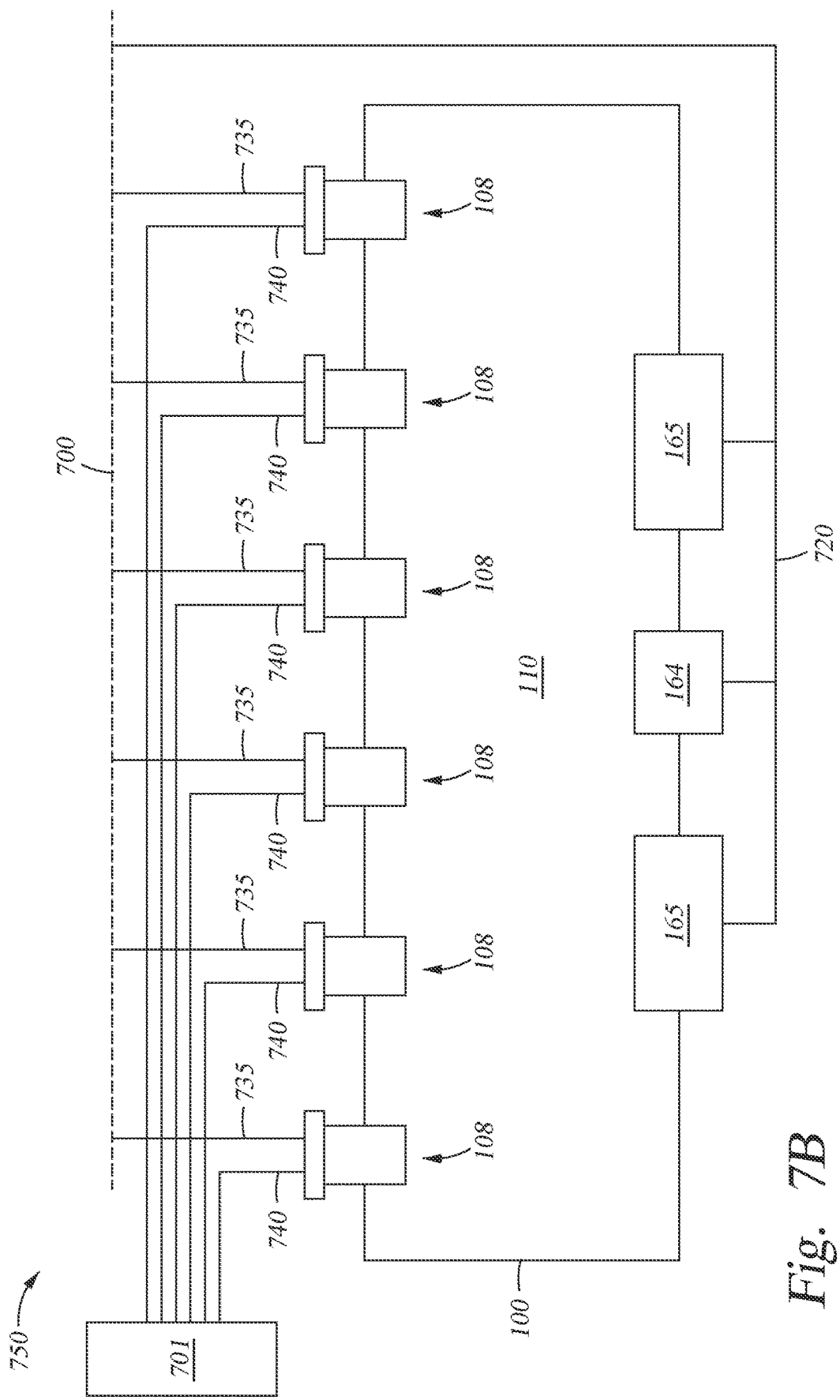
FIG. 7B is a schematic gas flow diagram of the gas mixture assembly of FIG. 7A as well as a second gas mixture assembly, according to embodiments of the present disclosure.

FIG. 7B is a schematic gas flow diagram of the gas mixture assembly 700 of FIG. 7A as well as a second gas mixture assembly 701, according to embodiments of the present disclosure. Each of the gas injectors 108 are attached to one of the mixed gas conduits 735. Each of the mixed gas conduits 735 extend from the delivery assembly 700. The delivery assembly 700 is illustrated more fully in FIG. 7A. The second gas mixture assembly 701 is similar to the delivery assembly 700. The second gas mixture assembly 701 is connected to each of the gas injectors 108 via a plurality of second mixed gas conduits 740. The second mixed gas conduits 740 are similar to the mixed gas conduits 735, but extend from the second gas mixture assembly 701. Each of the components within the second gas mixture assembly 701 is similar to the components within the delivery assembly 700.

The second gas mixture assembly 701 may be utilized along with the multi-tiered injector insert 600 of FIGS. 6A-6D. In embodiments described herein, the delivery assembly 700 supplies gas to the first gas introduction passage 614a (FIGS. 6B and 6C) of the gas injectors 108 while the second gas mixture assembly 701 supplies gas to the second gas introduction passage 614b (FIGS. 6B and 6C)

of the gas injectors 108. Therefore, both sheets of gas dispensed by the gas injectors 108 may be precisely controlled in both flow rate and process gas concentration.

Each of the exhaust modules 165 and the lower chamber exhaust passage 164 are in fluid communication with the exhaust conduit 720 for removal of gases supplied by both of the first gas mixture assembly 700 and the second gas mixture assembly 701. In some embodiments, both of the gas mixture assemblies 700, 701 share a common exhaust system, such as the exhaust conduit 720 and the exhaust pump 734.

The first gas mixture assembly 700 and the second gas mixture assembly 701 may supply either the same or different gases. In some embodiments, the first gas mixture assembly 700 provides a first process gas to deposit a layer on the substrate 150. The second gas mixture assembly 701 is utilized to provide a second process gas to the process volume 110. The second process gas may be similar to the first process gas and deposit a second layer on the substrate 150. Alternatively, the second gas mixture assembly 701 provides a purge gas, a cleaning gas, or an etchant gas. In some embodiments, the same gases are utilized, but provided at different flow rates or concentrations. Gases may be supplied via the first gas mixture assembly 700 and the second gas mixture assembly 701 either simultaneously or in a staggered fashion depending upon the gases flowed therethrough and the desired processes being performed within the process chamber 100.

Figure 8:
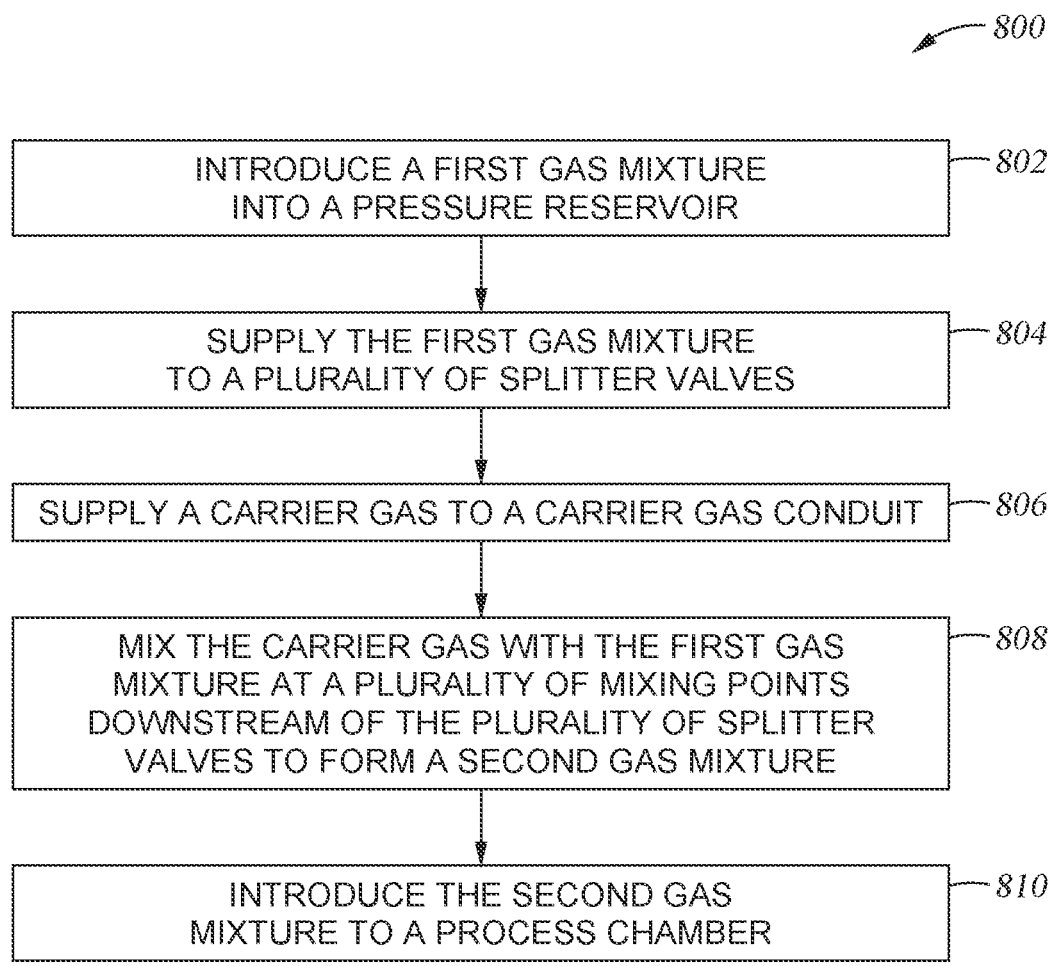
FIG. 8 is a method flow diagram for use with the gas mixture assembly of FIG. 7A, according to embodiments of the present disclosure.

FIG. 8 is a method flow diagram 800 for use with the gas delivery assembly 700 of FIG. 7A, according to embodiments of the present disclosure. The method 800 is utilized to control the process gas flow and concentration into a process volume, such as the process volume 110. During an operation 802, a first gas mixture is introduced into a gas reservoir, such as the gas reservoir 706. The first gas mixture includes a first concentration of a process gas.

The gas reservoir is a pressure reservoir configured to maintain a quantity of gas therein at a predetermined pressure. The quantity of gas is greater than about 100 sccm, such as greater than about 100 cm$^3$ of process gas, such as about 100 cm$^3$ to about 750 cm$^3$, such as about 100 cm$^3$ to about 500 cm$^3$. The pressure of the first gas mixture within the gas reservoir 706 is held within the predetermined pressure ranges described above to avoid a resonance mode within the gas reservoir, which may create dynamic pressure oscillation. An exhaust divert valve and a plurality of splitter valves are utilized to hold a near constant pressure within the gas reservoir. The exhaust divert valve is the exhaust divert valve 708 while the plurality of splitter valves are the splitter valves 726a-726f.

The first gas mixture is introduced into the gas reservoir by a process gas source, such as the process gas source 702. The process gas source is configured to supply a first gas mixture, which contains a process gas. The process gas may be one or a combination of a silicon containing gas, a germanium containing gas, a nitrogen containing gas, a carbon containing gas, or an oxygen containing gas. Other types of process gases, not listed, are also contemplated. The process gas source supplies the first gas mixture at a predetermined first process gas concentration and flow rate, such that the mass flow rate of components within the first gas mixture are controlled by the process gas source. The flow rate of the first gas mixture from the process gas source is a first flow rate. The first flow rate is about 100 sccm to about 2500 sccm, such as about 100 sccm to about 2000 sccm.

After the operation 802, another operation 804 of supplying the first gas mixture to a plurality of splitter valves is performed. The plurality of splitter valves may be the splitter valves 726a-726f. The plurality of splitter valves are each disposed on a different branch of a splitter conduit, such as the splitter conduit 725. Each of the plurality of splitter valves is utilized to control a flow rate of the first gas mixture therethrough. Therefore, the splitter valves are utilized to control the flow rate of the first gas mixture across each of the branches of the splitter conduit 725. The flow rate of the first gas mixture through each of the splitter valves is equal to the total flow rate of the first gas mixture from the process gas source divides by the number of splitter valves. In embodiments wherein there are five splitter valves, the flow rate of the first gas mixture is about 20 sccm to about 500 sccm, such as about 20 sccm to about 400 sccm. In embodiments wherein there are six splitter valves, the flow rate of the first gas mixture is about 15 sccm to about 420 sccm, such as about 15 sccm to about 335 sccm. Each of the splitter valves may be opened or closed to control the flow rate of the first gas mixture. In some embodiments, the splitter valves are controlled to allow a partial flow rate of the first gas mixture therethrough. Each of the splitter valves are controlled independently to allow each of the splitter valves to be tuned for the desired gas flow therethrough. After passing through the splitter valves, the first gas mixture is flowed into a plurality of split gas conduits, such as the split gas conduits 733. One split gas conduit may be coupled to each of the splitter valves. The split gas conduits 733 carry the first gas mixture therethrough and connect to a plurality of mixing points, such as the plurality of mixing points 732. Each of the split gas conduits 733 are coupled to one of the mixing points 732.

Another operation 806 of supplying a carrier gas to a carrier gas conduit is performed either before, simultaneously with, or after the operation 804. The carrier gas is supplied during the operation 806 by a carrier gas source. The carrier gas source may be the carrier gas source 728. The carrier gas source is configured to supply the carrier gas at a flow rate of less than about 30 slm, such as about 5 slm to about 30 slm, such as about 10 slm to about 30 slm. The carrier gas may be any one or a combination of helium (He), nitrogen ($N_2$), hydrogen ($H_2$), argon (Ar), or oxygen ($O_2$). Other carrier gases are also envisioned. The carrier gas conduit may be the carrier gas conduit 730. The carrier gas conduit branches into a plurality of carrier gas lines. One carrier gas line is connected to each of the plurality of mixing points.

Concurrently with and after the carrier gas is supplied through the carrier gas conduit in the operation 806 and the first gas mixture has been flowed through the splitter valves in the operation 804, the carrier gas and the first gas mixture are combined during an operation 808. Combining the first gas mixture and the carrier gas is performed at the plurality of mixing points. Each of the mixing points of the plurality of mixing points may be an intersection of one of the carrier gas lines of the carrier gas conduit and one of the split gas conduits. Each of the mixing points may therefore include a T-coupling or a Y-coupling to merge the distal ends of the carrier gas lines and the split gas conduits and mix the carrier gas and the first gas mixture. Combining the carrier gas and the first gas mixture creates a second gas mixture, which is flowed out of the mixing points and through a plurality of mixed gas conduits, such as the mixed gas conduits 735. When initially combined at the mixing points, the carrier gas and the first gas mixture may not be uniformly mixed. The carrier gas and the first gas mixture continue to mix as the second gas mixture is flowed through the plurality of mixed gas conduits and one or more gas injectors.

The second gas mixture has a second process gas concentration less than the first process gas concentration. The flow rate of the second gas mixture through each of the mixed gas conduits equal to the total flow of both the first gas mixture and the carrier gas through each of the mixed gas conduits. The flow rate of the second gas mixture through each of the mixed gas conduits is about 2 slm to about 10 slm, such as about 4 to about 8, such as about 6 slm. The flow rate of the second gas mixture through each of the mixed gas conduits may depend at least partially on the number of gas injectors within the process chamber. The ratio of the first gas mixture to the carrier gas within the second gas mixture is able to be controlled and tuned using the apparatus described herein, such that the concentration and flow rate of the first gas mixture through each of the injectors is tuned for each individual injector as desired for different processes. The total flow rate through each of the gas injectors may be kept constant while the concentration/partial pressure of the first gas mixture within the second gas mixture is varied between each of the gas injectors.

The second gas mixture is flowed to a plurality of gas injectors via the mixed gas conduits. Each of the mixed gas conduits is coupled to a gas injector and delivers the second gas mixture to the gas injector. Once the second gas mixture is introduced into the gas injector, the second gas mixture is introduced into the process volume of a process chamber during operation 810. The introduction of the second gas mixture into the process volume is performed at a predetermined rate and gas distribution. Introducing the second gas mixture enables formation of one or more layers on top of a substrate disposed within the process volume.

Figure 9A:
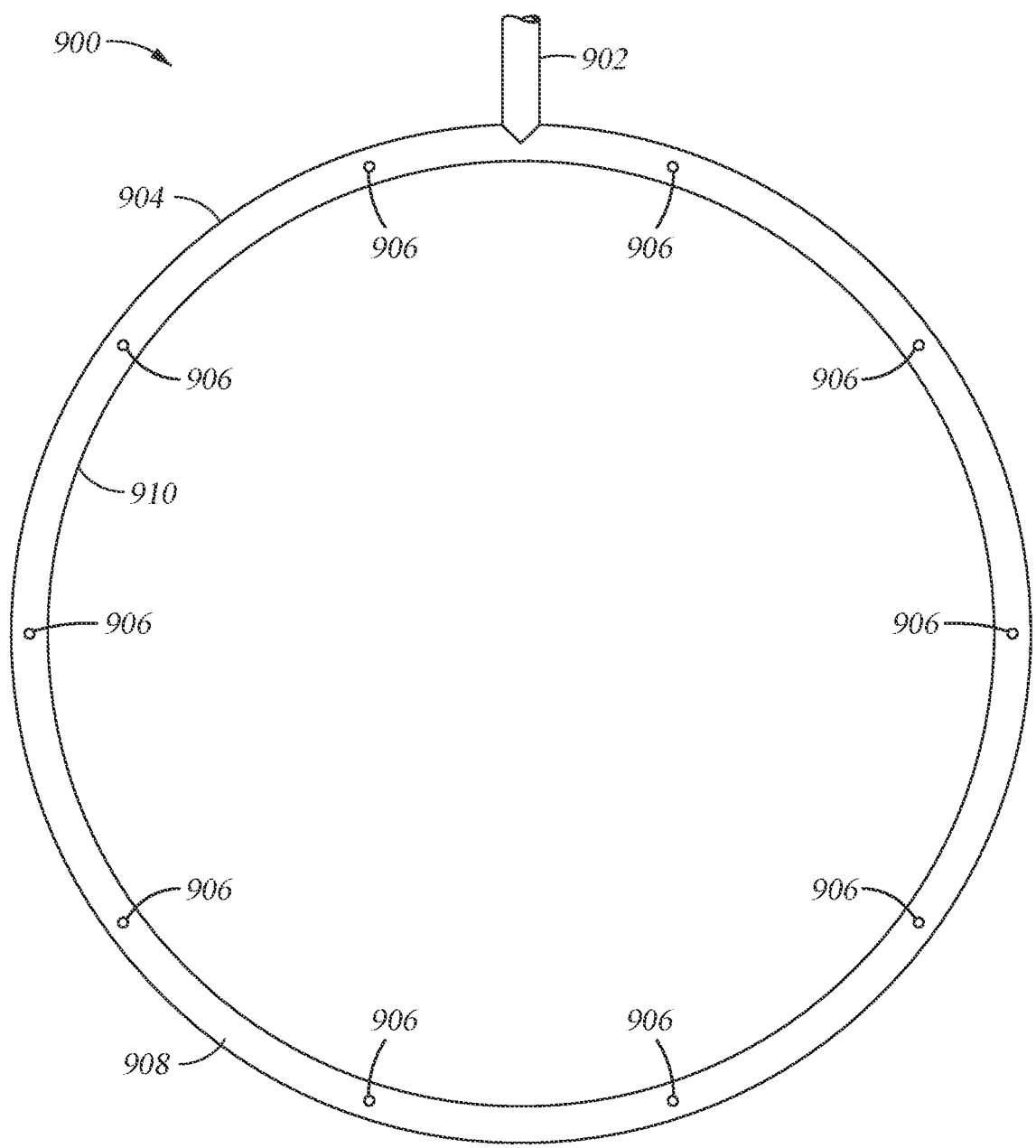
FIG. 9A is a schematic plan view of a ring injector, according to embodiments of the present disclosure.

FIG. 9A is a schematic plan view of a ring injector 900, according to embodiments of the present disclosure. The ring injector 900 is configured to be disposed around the process volume in addition to the gas injectors 108. The ring injector 900 is disposed inside of the process volume 110 and attached to the inner surface 404 of the inject ring 116 or the inner surface 304 of the base ring 114. As shown in FIG. 1, the ring injector 900 is attached to the inner surface 404 of the inject ring 116. The ring injector 900 is disposed above the top surface of a substrate, while the substrate is in a processing position. Therefore, the ring injector 900 is disposed above the horizontal plane 125 of FIG. 1 and within the upper chamber 111. The ring injector 900 is configured feed a precursor into the process volume 110 through a plurality of holes 906. The ring injector 900 provides flexibility to precursor delivery within the chamber. The ring injector 900 supplements gas flow from the gas injectors 108 and may assist in controlling deposition rates near an edge of the substrate 150.

A ring supply line 902 is coupled to a distribution body 908. The distribution body 908 is a ring shaped distribution body 908 and is coupled to the ring supply line 902. The ring supply line 902 is configured to pass through a feed port (not shown) within the walls of the process chamber 100. The ring supply line 902 is configured to supply precursor gas to the distribution body 908. The ring supply line 902 and the distribution body 908 are hollow passages or conduits configured to allow process gases to flow therethrough. The distribution body 908 includes an outer ring surface 904 and an inner ring surface 910. The outer ring surface 904 is configured to be attached to a surface within the process volume 110, such as the inner surface 404 of the inject ring 116.

The inner ring surface 910 includes the plurality of holes 906 formed therethrough. The plurality of holes 906 are openings formed between an inner hollow portion of the distribution body 908 and the inner ring surface 910. The plurality of holes 906 are spaced around the inner ring surface 910 to allow gas to be distributed to different circumferential locations around the process volume 110. The diameter of the distribution body 908 as well as the size of the holes 906 is influenced by the flow rates desired and the desired location of precursor distribution.

The inner ring surface 910 has a diameter of about 250 mm to about 450 mm, such as about 300 mm to about 400 mm, such as about 350 mm. The size of each of the holes 906 is dependent upon the number of holes 906 as well as the location of the holes 906. The holes 906 may have a diameter of about 1 mm to about 5 mm in diameter, such as about 2 mm to about 4 mm in diameter, such as about 2 mm to about 3 mm in diameter. There are about 4 to 30 holes 906 disposed through the inner ring surface 910, such as about 6 to 25 holes 906, such as about 8 to 20 holes 906. The holes 906 are disposed evenly around the entire circumference of the inner ring surface 910. In some embodiments, the holes 906 are disposed asymmetrically around the inner ring surface 910. Asymmetrical distribution of the holes 906 may allow for increased process gas concentrations near edge locations of the substrate 150 further from the gas injectors 108 or the upper chamber exhaust passage openings 324 (FIG. 3B). Asymmetrical distribution further assists in controlling the gas flow through the process volume 110.

Figure 9B:
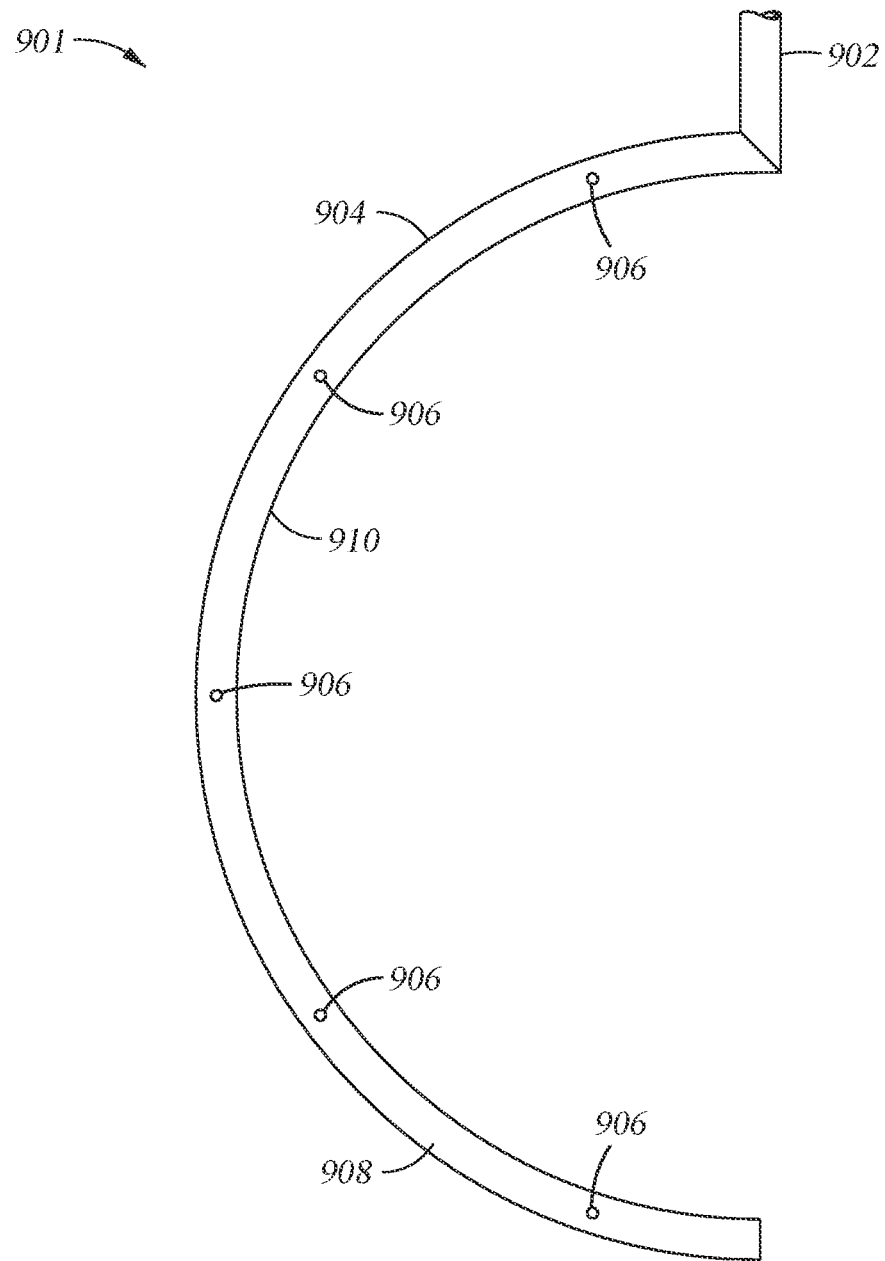
FIG. 9B is a schematic plan view of another embodiment of a ring injector, according to embodiments of the present disclosure.

FIG. 9B is a schematic plan view of another embodiment of a ring injector 901, according to embodiments of the present disclosure. In the embodiment of FIG. 9B, the ring injector 901 is only configured to encircle a portion of the process volume 110, such that the distribution body 908 is not a complete ring. In the embodiment of FIG. 9B, the distribution body 908 is a partial ring, such as a semicircle. The distribution body 908 may alternatively be a quarter ring or other arc segment. The distribution body 908 may alternatively be a three-quarter ring, such that the distribution body 908 forms about 75% of a circle. Other embodiments of the distribution body 908 form different partial rings. As described herein, a partial ring is defined as a portion of a ring which forms less than a full circle, such as about 5% to about 95% of a full circle, such as about 10% to about 90% of a full circle.

The embodiment of FIG. 9B wherein a partial ring is used for the distribution body 908 may be used for process operations wherein the distribution of gas is not desired around the entire circumference of a substrate. Outside of the partial ring formation of the distribution body 908, the ring injector 901 of FIG. 9B is similar to the ring injector 900 of FIG. 9A.

The components described herein allow greater uniformity and deposition control within a process chamber, such as the process chamber 100. Although illustrated together in one process chamber 100 herein, components described herein may be utilized separately with existing or alternative deposition process chambers.

While the foregoing is directed to embodiments of the present disclosure, other and further embodiments of the disclosure may be devised without departing from the basic scope thereof, and the scope thereof is determined by the claims that follow.

What is claimed is:

1. A process chamber for substrate processing comprising:
   an inject ring comprising one or more injector passages disposed through and on one half of the inject ring; and one or more gas injectors, each of the one or more gas injectors disposed inside of one of the injector passages, each of the gas injectors comprising:
an injector insert;
a gas introduction passage;
a gas diffusion passage fluidly coupled to the gas introduction passage, the gas diffusion passage comprising:
a plurality of passage splits; and
a plurality of pathways;
a first plenum disposed at a distal end of the gas diffusion passage, the first plenum defining a single volume;
an outlet opening disposed through an inject surface of the injector insert opposite the gas introduction passage and in fluid communication with the gas diffusion passage; and
a fin array disposed between the first plenum and the outlet opening, the fin array, comprising:
a plurality of fins disposed between a bottom surface and a top surface of the injector insert, the plurality of fins distributed to form a plurality of pathway extensions.

2. The process chamber of claim 1, wherein each of the one or more gas injectors further comprises one or more heaters through the injector insert.

3. The process chamber of claim 1, wherein there are three or more injector passages and three or more gas injectors, each of the gas injectors oriented towards a central portion of the inject ring.

4. The process chamber of claim 1, wherein the gas introduction passage is a single passage disposed through an injector base body.

5. The process chamber of claim 1, wherein the plurality of passage splits and the plurality of pathways comprise:
a first passage split extending from the gas introduction passage into two pathways of the plurality of pathways; and
two second passage splits splitting the two pathways into four pathways of the plurality of pathways.

6. The process chamber of claim 5, wherein a baffle array is disposed between the fin array and the outlet opening.

7. The process chamber of claim 1, further comprising a ring injector comprising:
a distribution body with an inner ring surface; and
a plurality of holes disposed through the inner ring surface.

8. A gas injector for use within a process chamber comprising:
a gas introduction passage disposed through the gas injector;
an injector insert, comprising:
a gas diffusion passage fluidly coupled to the gas introduction passage, the gas diffusion passage forming a gas distribution tree, the gas distribution tree comprising:
a plurality of passage splits; and
a plurality of pathways;
a first plenum disposed at a distal end of the gas diffusion passage, the first plenum defining a single volume;
an outlet opening disposed through an inject surface of the injector insert opposite the gas introduction passage and in fluid communication with the gas diffusion passage; and
a fin array disposed between the gas diffusion passage and the outlet opening, the fin array, comprising:
a plurality of fins disposed between a bottom surface and a top surface of the injector insert, the plurality of fins distributed to form a plurality of pathway extensions.

9. The gas injector of claim 8, wherein the plurality of passage splits and the plurality of pathways comprise:
a first passage split extending from the gas introduction passage into two pathways of the plurality of pathways; and
two second passage splits splitting the two pathways into four pathways of the plurality of pathways.

10. The gas injector of claim 8, wherein a baffle array is disposed between the fin array and the outlet opening.

11. The gas injector of claim 10, wherein the baffle array comprises a plurality of baffles, each baffle shaped to have a first surface facing the fin array which is wider than a second surface facing the outlet opening.

12. The gas injector of claim 8, further comprising one or more heaters disposed within the injector insert.

13. The gas injector of claim 12, wherein the one or more heaters are each a resistive heating element or a radiative heating element.

14. The gas injector of claim 8, wherein the gas introduction passage is a first gas introduction passage, the gas diffusion passage is a first diffusion passage, and the outlet opening is a first outlet opening, the injector insert further comprising:
a second gas introduction passage;
a second gas diffusion passage; and
a second outlet opening.

15. The gas injector of claim 14, wherein the first outlet opening is disposed below the second outlet opening.

16. The process chamber of claim 1, further comprising:
a base ring having the inject ring disposed on the base ring, the base ring comprising:
a substrate transfer passage disposed through the base ring on a first side of the base ring;
one or more upper chamber exhaust passages disposed through a second side of the base ring; and
a lower chamber exhaust passage disposed through the second side of the base ring, wherein the first side of the base ring is disposed on one side of a plane disposed through the base ring and the second side of the base ring is disposed on an opposite side of the plane from the first side.

17. A process chamber for substrate processing comprising:
an inject ring comprising one or more injector passages disposed through and on one half of the inject ring; and
one or more gas injectors, each of the one or more gas injectors disposed inside of one of the injector passages, each of the gas injectors comprising:
an injector base body defining a gas introduction passage; and
an injector insert extending from a back surface of the injector base body, the injector insert comprising:
a gas diffusion passage defined by the injector insert and fluidly coupled to the gas introduction passage, the gas diffusion passage comprising:
a plurality of passage splits; and
a plurality of pathways;
a first plenum disposed at a distal end of the gas diffusion passage, the first plenum defining a single volume;

an outlet opening disposed through an inject surface of the injector insert opposite the gas introduction passage and in fluid communication with the gas diffusion passage;

a fin array disposed between the first plenum and the outlet opening, the fin array, comprising:
- a plurality of fins disposed between a bottom surface and a top surface of the injector insert, the plurality of fins distributed to form a plurality of pathway extensions;

a second plenum disposed at a distal end of the fin array opposite the first plenum, the second plenum defining a single volume; and a baffle array disposed between the second plenum and the outlet opening, the baffle array comprising:
- a plurality of baffles that define a plurality of pathway exits.

18. The process chamber of claim 17, wherein each of the fins in the fin array are individually oriented in a different direction.

19. The process chamber of claim 17, wherein each baffle is shaped to have a first surface facing the fin array which is wider than a second surface facing the outlet opening.

20. The process chamber of claim 17, wherein the plurality of passage splits and the plurality of pathways comprise:
- a first passage split extending from the gas introduction passage into two pathways of the plurality of pathways; and
- two second passage splits splitting the two pathways into four pathways of the plurality of pathways.

* * * * *